United States Patent [19]
Tanaka et al.

[11] Patent Number: 6,097,472
[45] Date of Patent: Aug. 1, 2000

[54] APPARATUS AND METHOD FOR EXPOSING A PATTERN ON A BALL-LIKE DEVICE MATERIAL

[75] Inventors: Nobuyoshi Tanaka, Tokyo; Kenji Saito, Utsunomiya; Hideki Ina, Utsunomiya; Yoshiyuki Sekine, Utsunomiya, all of Japan

[73] Assignee: Canon Kabushiki Kaisha, Tokyo, Japan

[21] Appl. No.: 09/061,072

[22] Filed: Apr. 16, 1998

[30] Foreign Application Priority Data

Apr. 17, 1997 [JP] Japan .................................. 9-100178
Jul. 29, 1997 [JP] Japan .................................. 9-203218

[51] Int. Cl.[7] ............................. G03B 27/58; G03B 27/42
[52] U.S. Cl. ............................................. 355/47; 355/53
[58] Field of Search .................................. 355/43, 47, 49, 355/53, 72; 430/395, 1, 2; 359/8, 28

[56] References Cited

U.S. PATENT DOCUMENTS

| | | | |
|---|---|---|---|
| 3,582,176 | 6/1971 | Mathisen | 350/3.5 |
| 3,677,634 | 7/1972 | Mathisen | 355/2 |
| 4,339,168 | 7/1982 | Haines | 350/3.69 |
| 4,436,474 | 3/1984 | Brossman, Jr. et al. | 414/417 |
| 4,576,475 | 3/1986 | Kitagawa et al. | 355/91 |
| 5,113,064 | 5/1992 | Manhart | 250/201.9 |
| 5,198,914 | 3/1993 | Arns | 359/8 |
| 5,461,455 | 10/1995 | Coteus et al. | 355/43 |
| 5,574,537 | 11/1996 | Ozawa | 355/71 |
| 5,589,955 | 12/1996 | Amako et al. | 359/9 |
| 5,686,230 | 11/1997 | Nellissen | 430/395 |
| 5,815,247 | 9/1998 | Poschenrieder et al. | 355/71 |
| 5,835,195 | 11/1998 | Gibson et al. | 355/53 |
| 5,949,557 | 9/1999 | Powell | 359/8 |
| 5,955,776 | 9/1999 | Ishikawa | 257/618 |

FOREIGN PATENT DOCUMENTS

| | | | |
|---|---|---|---|
| 3-61820 | 3/1991 | Japan . | |
| 2221353 | 1/1990 | United Kingdom | 430/1 |
| WO 86/00460 | 1/1986 | WIPO | 430/1 |

*Primary Examiner*—Safet Metjahic
*Assistant Examiner*—Hung Henry Nguyen
*Attorney, Agent, or Firm*—Fitzpatrick, Cella, Harper & Scinto

[57] ABSTRACT

An exposure apparatus for exposing a pattern on a device material includes a holder for chucking and holding a silicon ball, a spherical reticle on which a hologram of a circuit pattern to be exposed is formed, a light source, a focusing optical system for focusing light emitted by the light source on a first position, and an elliptic mirror having a first focal point at the first position and a second focal point at the central position of the silicon ball (reticle). The center of the reticle coincides with the center of the silicon ball.

29 Claims, 31 Drawing Sheets

APPARATUS AND METHOD FOR EXPOSING A PATTERN ON A BALL-LIKE DEVICE MATERIAL

BACKGROUND OF THE INVENTION

1. Field of the Invention

The present invention relates to an exposure apparatus and method for exposing a pattern on a device material and, more particularly, to an exposure apparatus and method suitable for device materials such as a ball-like semiconductor material.

2. Description of the Related Art

Flat silicon wafers have conventionally been known. Recently, ball-like semiconductors using silicon balls with a diameter of about 1 mm are proposed.

SUMMARY OF THE INVENTION

It is an object of the present invention to expose a pattern on a wider region of the surface of a ball-like device material such as a silicon ball with high throughput.

According to an aspect of the present invention, an exposure apparatus for exposing a pattern on a device material comprises a device material holding portion for holding a ball-like device material, and an exposure portion for exposing the pattern on at least a half region of an entire surface of the ball-like device material at once.

In the exposure apparatus, the exposure portion preferably comprises a reticle holding portion for holding a reticle on which a hologram for forming a pattern to be exposed on the ball-like device material is recorded, and preferably exposes the pattern on the ball-like device material using a reproduced pattern of the hologram.

In the exposure apparatus, the exposure portion preferably comprises a light source, a focusing optical system for focusing light emitted by the light source on a first position, and an elliptic mirror having a first focal point at the first position, and a second focal point at a central position of the device material when the ball-like device material is held at a proper position by the device material holding portion.

In the exposure apparatus, the hologram preferably includes a first hologram for exposing a band-like region of a surface of the ball-like device material, and a second hologram for exposing a circular region of the surface of the ball-like device material on an optical system side. The exposure portion preferably comprises a first illumination system for illuminating the first hologram, and a second illumination system for illuminating the second hologram. The first illumination system preferably comprises a light source, a focusing optical system for focusing light emitted by the light source on a first position, and an elliptic mirror having a first focal point at the first position and a second focal point at a central position of the device material when the ball-like device material is held at a proper position by the device material holding portion. The focusing optical system constituting the first illumination system preferably has a portion for passing through light emitted by the light source as a substantially parallel light beam, and the portion and the light source preferably constitute the second illumination system. The portion for passing through light emitted by the light source as a substantially parallel light beam is preferably an opening portion.

In the exposure apparatus, the device material holding portion preferably comprises a tee for chucking and holding the ball-like device. The device material holding portion preferably comprises a chuck for holding a holder having at least one tee. The holder preferably has an alignment reference mark. The exposure apparatus preferably further comprises a position detector for detecting a position of the reference mark.

In the exposure apparatus, the ball-like device material preferably has an alignment reference mark. The exposure apparatus preferably further comprises a position detector for detecting a position of the reference mark.

In the exposure apparatus, the holder and the ball-like device material preferably have alignment reference marks, respectively. The reference mark of the holder is preferably formed in correspondence with each tee. The exposure apparatus preferably further comprises a memory for storing information representing a positional relationship between the reference mark of the holder and the reference mark of the ball-like device material held by the tee, a position detecting portion for detecting a position of the reference mark of the holder, and a driving portion for adjusting a position of the holder, wherein the driving portion preferably adjusts the position of the holder on the basis of the information stored in the memory and a detection result obtained by the detecting portion, and preferably aligns the ball-like device material held by the holder to a proper position.

According to another aspect of the present invention, a reticle for defining a pattern to be exposed on a device material comprises a spherical hologram whose reproduced pattern is to be formed on a surface of a ball-like device material.

According to still another aspect of the present invention, an exposure apparatus for exposing a pattern on a device material comprises a device material holding portion for holding the device material, and an exposure portion for exposing the pattern on a surface of the device material, wherein the exposure portion has a reticle holding portion for holding a reticle on which a hologram for forming a pattern to be exposed on the device material is recorded, and exposes the pattern on the device material using a reproduced pattern of the hologram.

According to still another aspect of the present invention, an exposure method of exposing a pattern on a ball-like device material comprises the step of preparing a reticle on which a hologram for forming a pattern to be exposed on the ball-like device material is recorded, and exposing the pattern on the ball-like device material using a reproduced pattern of the reticle.

According to still another aspect of the present invention, an exposure method of exposing a pattern on a ball-like device material comprises the step of preparing a reticle on which a hologram for forming a pattern to be exposed on the ball-like device material is recorded, and exposing the pattern on at least a half region of an entire surface of the ball-like device material using a reproduced pattern of the reticle at once.

According to still another aspect of the present invention, an exposure method of exposing a pattern on a device material comprises the step of preparing a reticle on which a hologram for forming a pattern to be exposed on the device material is recorded, and exposing the pattern on the device material using a reproduced pattern of the reticle.

According to still another aspect of the present invention, a method of aligning a ball-like device material comprises the holding step of holding at least one ball-like device material by a holding portion, the first detecting step of detecting a positional relationship between the ball-like device material and the holding portion, the mounting step of mounting the holding portion on an exposure apparatus, the second detecting step of detecting a position of the holding portion, and the aligning step of adjusting the position of the holding portion on the basis of detection results in the first and second detecting steps, and aligning the ball-like device held by the holding portion to a proper position.

According to still another aspect of the present invention, an exposure apparatus for exposing a pattern on a device material comprises a reticle holding portion for holding a reticle having a pattern formed by a kinoform, a device material holding portion for holding the device material, and an exposure portion for exposing the device material through the pattern of the reticle.

In the exposure apparatus, the device material to be exposed is preferably a ball-like device material.

In the exposure apparatus, the exposure portion preferably exposes the pattern on at least a half region of an entire surface of the ball-like device material at once.

In the exposure apparatus, the reticle preferably is flat.

In the exposure apparatus, the exposure portion preferably exposes, through a parabolic mirror, a backside portion of a surface of the ball-like device material when viewed from the reticle.

In the exposure apparatus, the exposure portion preferably exposes, through an elliptic mirror, a backside portion of a surface of the ball-like device material when viewed from the reticle.

In the exposure apparatus, the kinoform is preferably formed to allow a principal ray to strike each point on a surface of the device material in exposure. The kinoform is preferably formed to reduce illuminance irregularity by diffracting light so as to fall outside an angle used in exposure.

In the exposure apparatus, the kinoform is optimized on the basis of a genetic algorithm.

In the exposure apparatus, the kinoform is preferably optimized on the basis of simulated annealing.

In the exposure apparatus, the device material holding portion preferably comprises a tee for chucking and holding the ball-like device material. The device material holding portion preferably comprises a chuck for holding a holder having at least one tee. The holder preferably has an alignment reference mark. The exposure apparatus preferably further comprises a position detector for detecting a position of the reference mark.

In the exposure apparatus, the ball-like device material preferably has an alignment reference mark. The exposure apparatus preferably further comprises a position detector for detecting a position of the reference mark.

In the exposure apparatus, the holder and the ball-like device material preferably have alignment reference marks, respectively. In the exposure apparatus, the reference mark of the holder is preferably formed in correspondence with each tee.

The exposure apparatus preferably further comprises a memory for storing information representing a positional relationship between the reference mark of the holder and the reference mark of the ball-like device material held by the tee, a position detecting portion for detecting a position of the reference mark of the holder, and a driving portion for adjusting a position of the holder, wherein the driving portion preferably adjusts the position of the holder on the basis of the information stored in the memory and a detection result obtained by the detecting portion, and preferably aligns the ball-like device material held by the holder to a proper position.

According to still another aspect of the present invention, an exposure method of exposing a pattern on a device material comprises the step of preparing a reticle having a pattern formed by a kinoform, and exposing the device material through the reticle.

According to still another aspect of the present invention, an exposure method of exposing a pattern on a device material comprises the step of preparing a reticle having a pattern formed by a kinoform, and exposing a ball-like device material through the reticle.

According to still another aspect of the present invention, an exposure method of exposing a pattern on a device material comprises the step of preparing a reticle having a pattern formed by a kinoform, and exposing at least a half region of an entire surface of a ball-like device material through the reticle at once.

Further objects, features and advantages of the present invention will become apparent from the following detailed description of embodiments of the present invention with reference to the accompanying drawings.

DETAILED DESCRIPTION OF THE PREFERRED EMBODIMENTS

Figure 7:
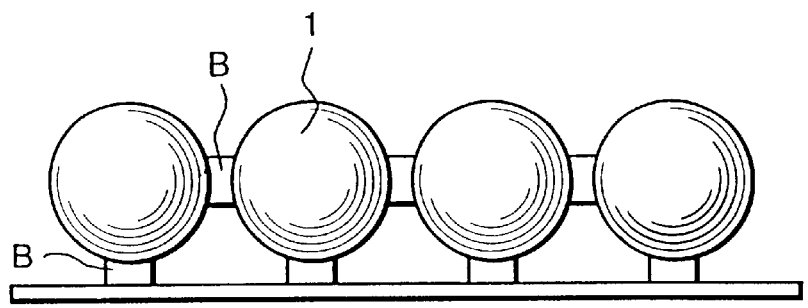
FIG. 7 is a view showing a semiconductor device obtained by connecting a plurality of silicon balls through bumps.

FIG. 7 is a view showing one example of applications of silicon balls. As shown in FIG. 7, silicon balls 1 are used in a coupled state through, e.g., bumps B.

Figure 8:
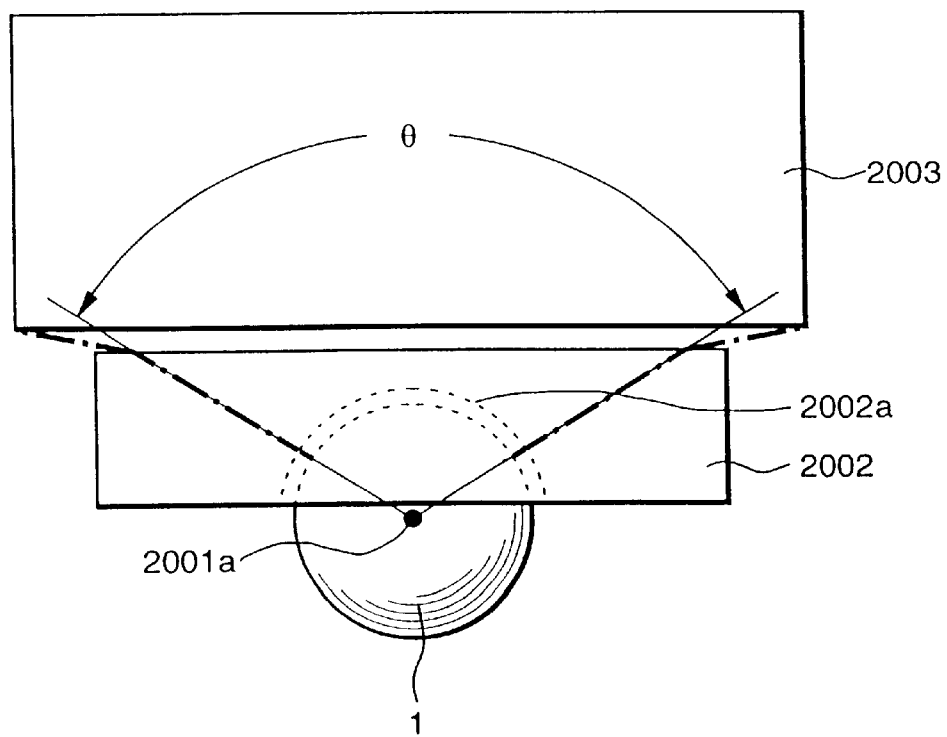
FIG. 8 is a view showing an example of an exposure apparatus of exposing a pattern on a narrow region of the silicon ball.

FIG. 8 is a view showing one example of the structure of a silicon ball exposure apparatus. The silicon ball 1 is made of a ball-like silicon material, and its exposure surface is coated with a resist film. The diameter of the silicon ball 1 is, e.g., on the order of one millimeter (e.g., 1 mm). A reticle 2002 has a shape obtained by hollowing out a flat member into a semispherical shape. A circuit pattern surface 2002a is formed at the hollow portion of the reticle 2002.

An illumination light beam emitted by an illumination system 2003 is incident on the exposure surface of the ball-like device 1 at a right angle. By this illumination light beam, a pattern corresponding to a circuit pattern formed on the circuit pattern surface 2002a is exposed on the exposure surface of the silicon ball 1.

The exposure apparatus shown in FIG. 8 is suitable for exposing the silicon ball, but is disadvantageous in that the region in which simultaneous exposure is enabled (region θ) by this apparatus is small. It is an object of the present invention to increase the region of the silicon ball in which simultaneous exposure is enabled.

First Embodiment

The first embodiment of the present invention discloses an exposure apparatus suitable for simultaneous exposure on a half or more region of the entire spherical surface of a silicon ball 1.

Figure 1:
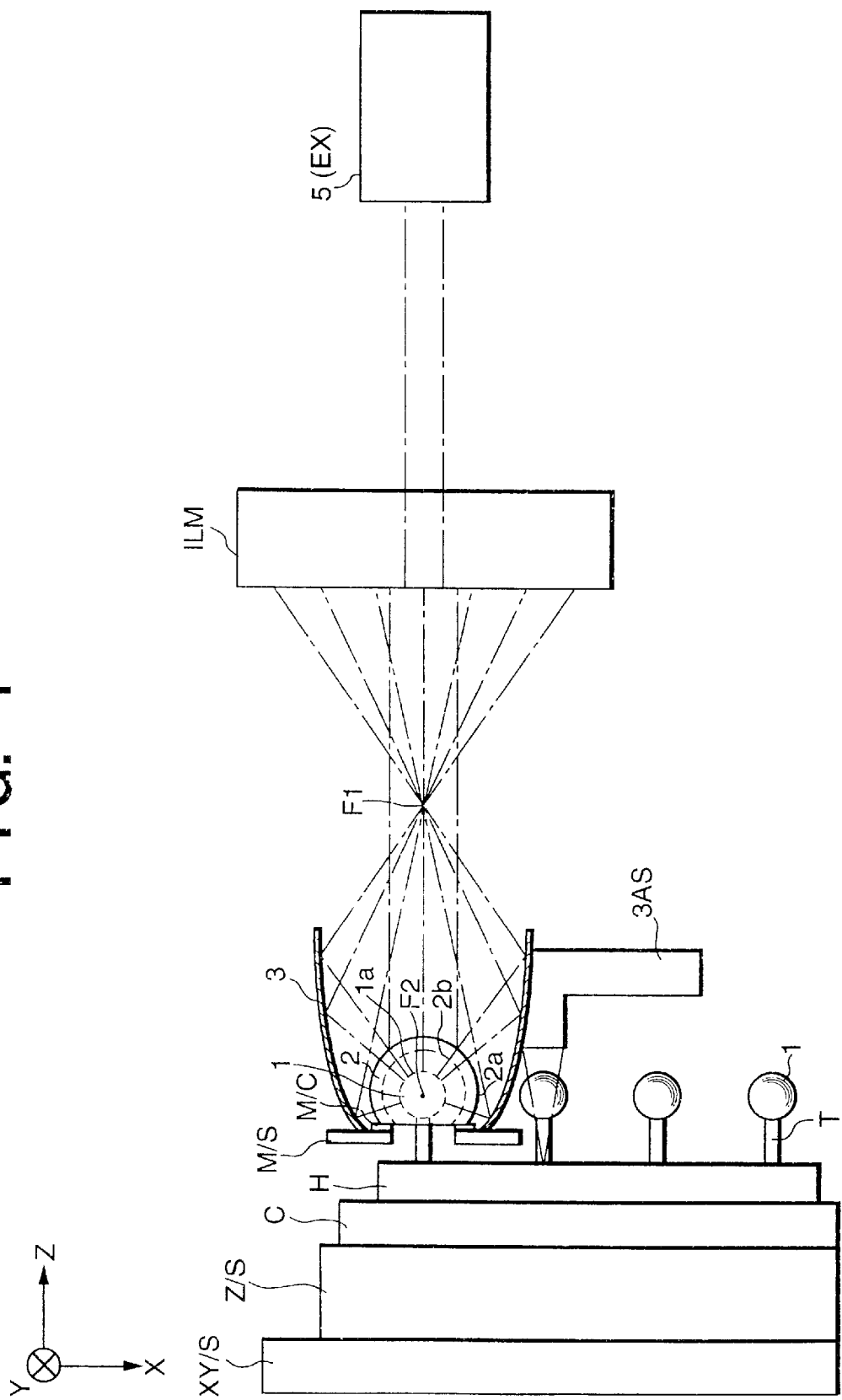
FIG. 1 is a view showing the schematic arrangement of an exposure apparatus according to the first embodiment of the present invention.

FIG. 1 is a view showing the schematic arrangement of the exposure apparatus according to the first preferred embodiment of the present invention. This exposure apparatus can expose a pattern on a half or more region of the entire spherical surface of the silicon ball 1 at once.

In FIG. 1, a reticle 2 has a pattern surface 2a on which a hologram of a circuit pattern to be exposed is formed. A reproduced pattern of this hologram forms a desired circuit pattern on a surface 1a of the silicon ball 1. The outer surface of the reticle 2 is a spherical surface forming the hologram pattern surface 2a, and an inner surface 2b of the reticle 2 is a spherical surface concentric with the spherical surface forming the pattern surface 2a. The reticle 2 includes a cavity.

The exposure apparatus comprises two illumination systems in order to expose a half or more region of the entire spherical surface of the silicon ball 1 at once. The hologram pattern surface 2a of the reticle 2 has two holograms HR1 and HR2 in correspondence with the two illumination systems (see FIGS. 5 and 6).

Figure 2:
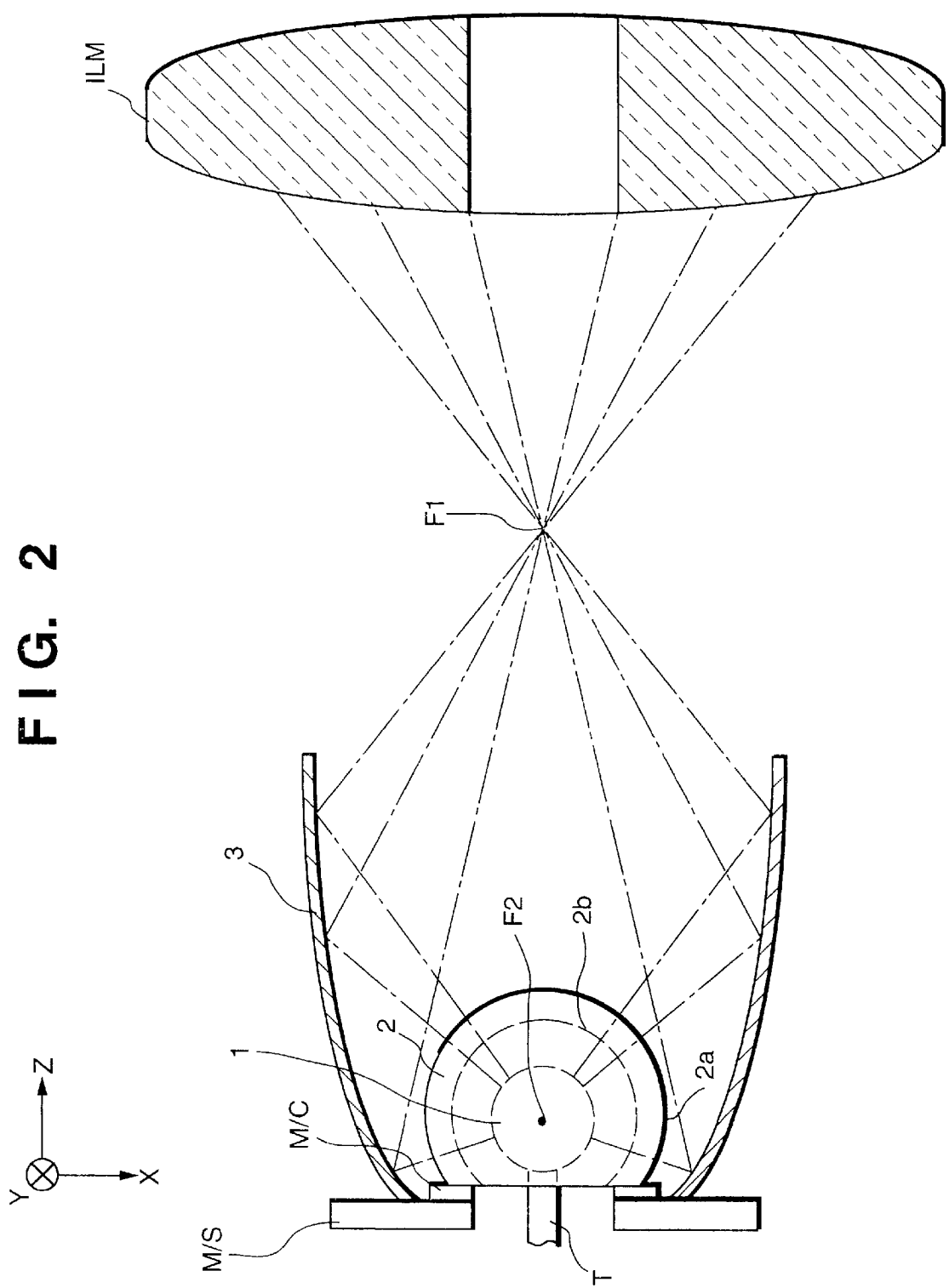
FIG. 2 is a view showing an illumination system (first illumination system) using an elliptic mirror.
Figure 3:
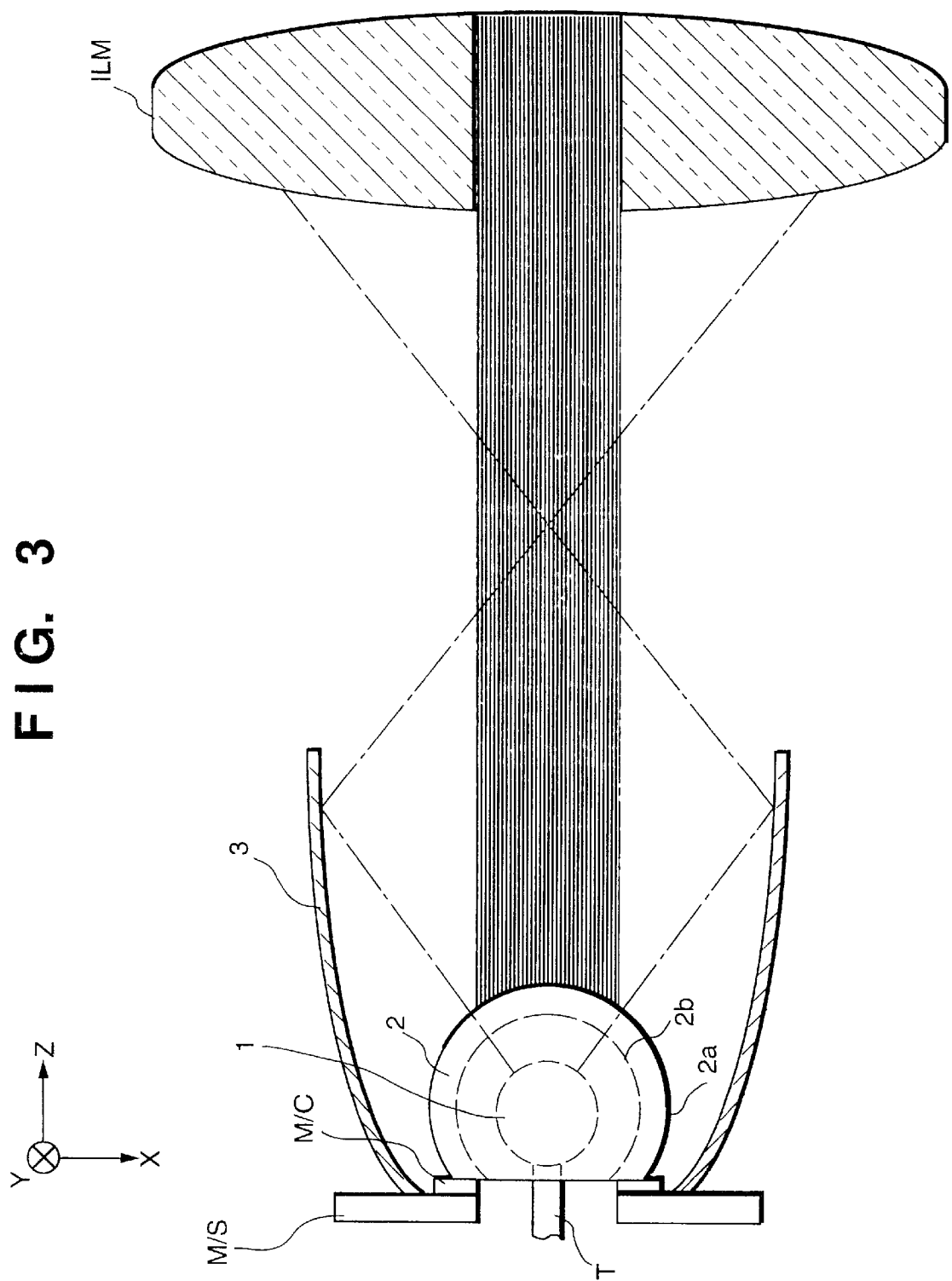
FIG. 3 is a view showing an illumination system (second illumination system) not using any elliptic mirror.

The two illumination systems will be explained below. FIG. 2 shows the first illumination system, and FIG. 3 shows the second illumination system. The first illumination system is an illumination system using an elliptic mirror, whereas the second illumination system is an illumination system not using any elliptic mirror.

The first illumination system will be described. Light emitted by an exposure light source (e.g., an excimer laser) 5 shown in FIG. 1 is focused at one focal point (first focal point) F1 of an elliptic mirror 3 by an illumination light system ILM serving as a focusing optical system. The silicon ball 1 is arranged to make its center coincide with another focal point (second focal point) F2 of the elliptic mirror 3. All the light reflected by the elliptic mirror 3 propagates toward the center (second focal point F2) of the silicon ball 1.

In this manner, light is irradiated perpendicularly to the surface of the reticle 2 to form the reproduced pattern of the hologram of the hologram pattern surface 2a on the surface 1a of the silicon ball 1. As a result, a desired circuit pattern can be transferred to the surface 1a.

With this arrangement, the elliptic mirror 3 makes it possible to uniformly illuminate the backside surfaces (opposite to the exposure light source 5) of the reticle 2 and the silicon ball 1. The reproduced pattern of the hologram is formed as a desired circuit pattern on the surface of the silicon ball 1.

Since the elliptic mirror 3 of the illumination system and the illumination light system ILM can only be practically constituted to have a finite illumination range, of the illumination regions of the reticle 2 and the silicon ball 1, regions near the exposure light source 5 cannot be illuminated. To expose a half or more region of the entire surface of the silicon ball 1 at once, therefore, the second illumination system for illuminating the regions near the exposure light source 5 at the same time as the first illumination system is required.

The second illumination system will be explained with reference to FIG. 3. A parallel light beam emitted by the exposure light source 5 shown in FIG. 1 illuminates the reticle 2 through the illumination light system ILM. Accordingly, the reproduced pattern of the formed hologram is transferred to the surface of the silicon ball 1. In the illumination light system ILM, its central portion is an opening portion constituting the second illumination system, and its peripheral portion is a lens portion constituting the first illumination system.

As described above, in this exposure apparatus, holograms for the two illumination systems must be formed on the reticle 2 in order to transfer the circuit pattern on the silicon ball 1 using the two illumination systems.

Figure 4:
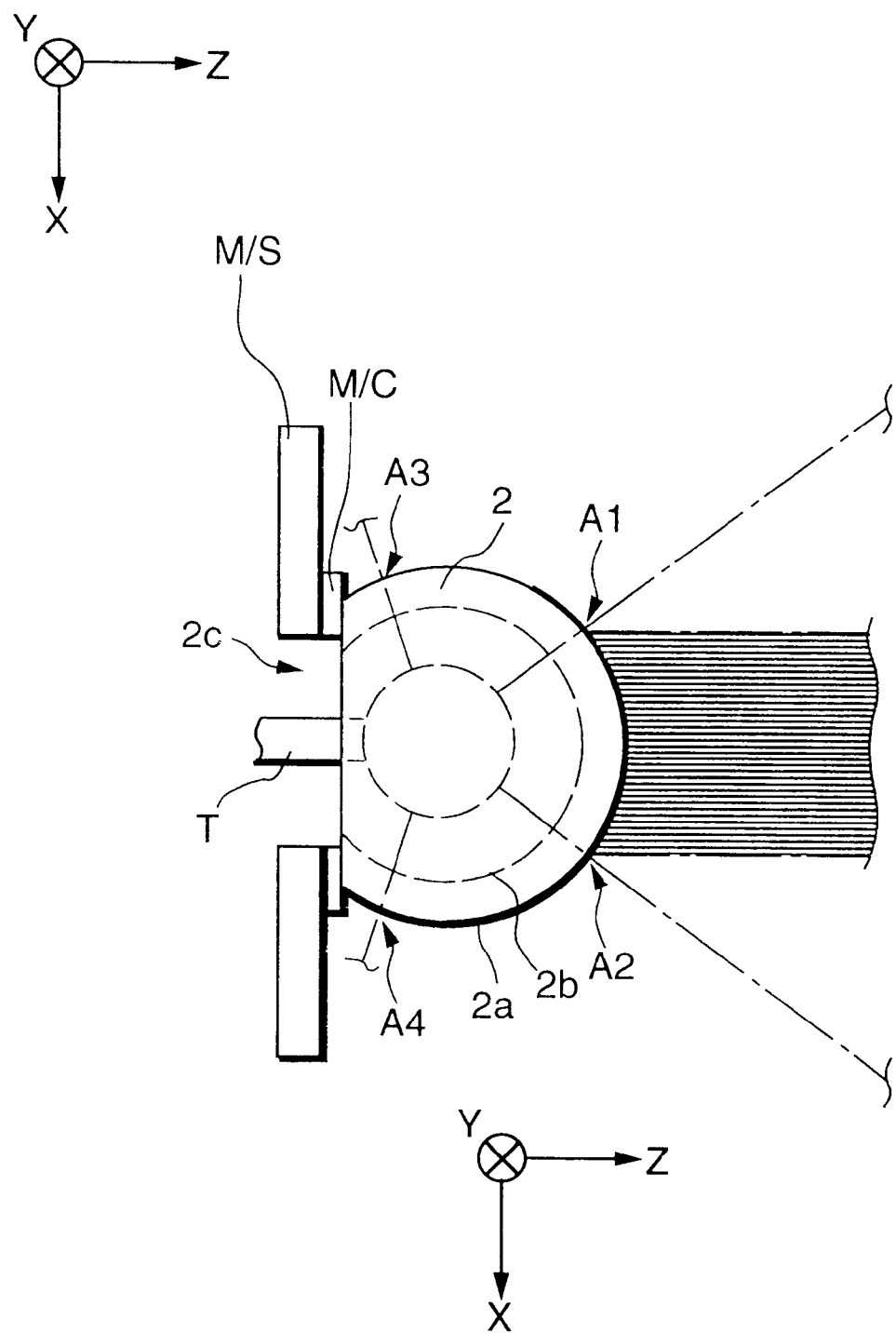
FIG. 4 is a view showing a reticle on which a hologram of a circuit pattern is formed on a pattern surface.
Figure 5:
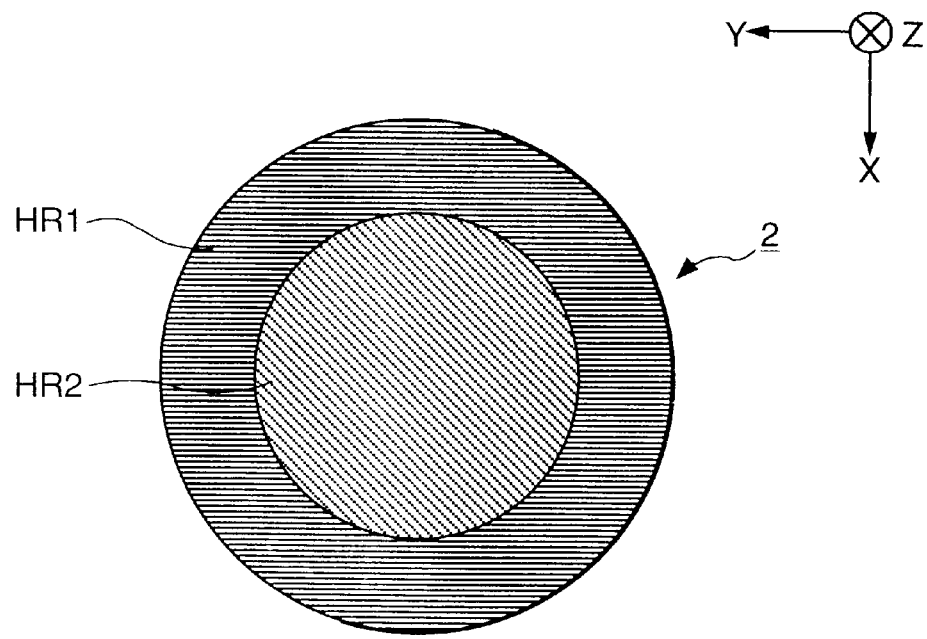
FIG. 5 is a view of the reticle when viewed from an exposure light source.
Figure 6:
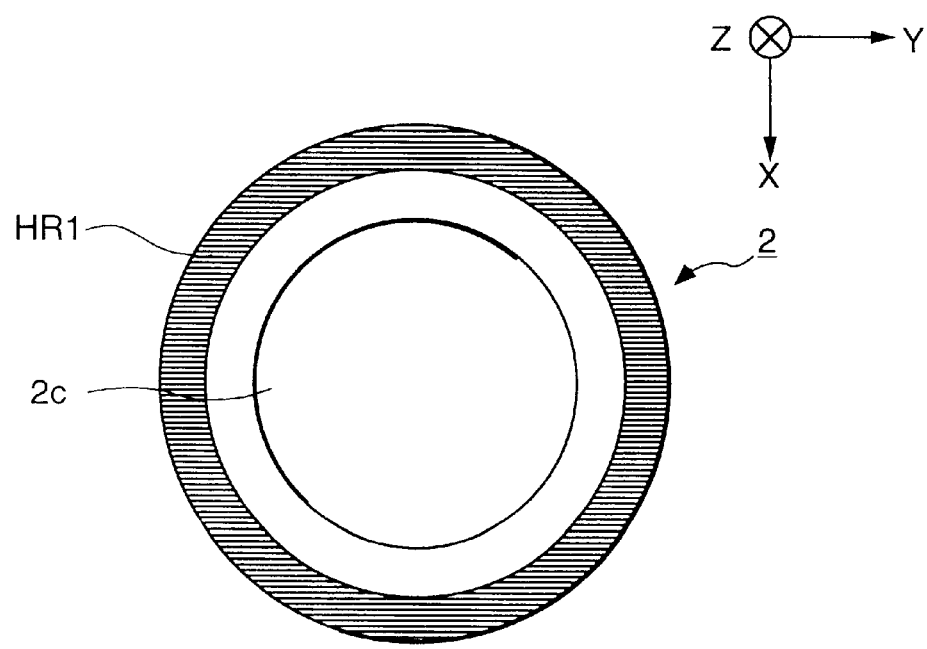
FIG. 6 is a view of the reticle when viewed from the opposite side to the exposure light source.

FIG. 4 is an enlarged view of the reticle 2 with the hologram of the circuit pattern formed on the pattern surface 2a. FIG. 5 is a view of the reticle 2 when viewed from the exposure light source 5. FIG. 6 is a view of the reticle 2 when viewed from the opposite side to the exposure light source 5. The hologram of the reticle 2 will be described with reference to FIGS. 4 to 6.

A band-like region defined by A1 and A3, and A2 and A4, shown in FIG. 4, is illuminated by the first illumination system using the elliptic mirror 3. A hologram in this band-like region is formed using light perpendicular to the pattern surface 2a as reference light. On the other hand, a region defined by A1 and A2, shown in FIG. 4, is illuminated by the second illumination system not using any elliptic mirror. A hologram in this circular region is formed using light not perpendicular to the pattern surface 2a (except for the central portion of the pattern surface 2a) as reference light.

In FIG. 5, an outer annular portion is a region where the hologram HR1 is formed using light perpendicular to the pattern surface 2a as reference light, and an inner circular portion is a region where the hologram HR2 is formed using light not perpendicular to the pattern surface 2a (except for the central portion of the pattern surface 2a) as reference light.

In FIG. 6, an outer annular portion is a region where the hologram HR1 is formed using light perpendicular to the pattern surface 2a as reference light, and an inner annular portion is a region where no hologram is formed. As shown in FIG. 6, the reticle 2 has an opening portion 2c through which the silicon ball 1 is inserted or removed.

The reticle 2 which has the hollow structure and the two types of hologram patterns formed on the outer spherical surface can be prepared by a general EB beam lithography system for drawing a pattern on a lithography reticle, to which a driving mechanism along the z-axis is added (in this case, the z-axis means a z-axis when the plane of a general reticle is defined as the X-Y plane). A hologram pattern to be formed is a computer generated hologram of a desired circuit pattern.

As shown in FIGS. 1 and 2, the reticle 2 is chucked and held by a mask chuck M/C on a mask stage M/S near the elliptic mirror 3. The silicon ball 1 is supported by a tee T like a golf ball supported by a golf tee. The silicon ball 1 supported by the tee T is inserted in the cavity of the reticle 2 so as to make the center of the reticle 2 and the center of the silicon ball 1 coincide with each other, and then the silicon ball 1 is exposed at once.

Alignment and exposure sequences according to the preferred embodiment of the present invention will be described.

In this exposure apparatus, a plurality of silicon balls 1 are chucked and supported by the tees T of a holder H. Chucking and supporting the silicon balls 1 by the tees T will also be referred to as tee-up chucking. The first embodiment is directed to an example of supporting four silicon balls 1 by the tees T and exposing them at once, as shown in FIG. 1.

The holder H has four tees T. While the silicon balls 1 are chucked by the tees T, the holder H is conveyed from outside the exposure apparatus and chucked and held by a chuck C.

A Z stage Z/S capable of driving the chuck C along the z-axis is arranged below the chuck C, and an X-Y stage XY/S with a laser interferometer is arranged below the Z stage Z/S. With this arrangement, the chuck C (silicon ball 1) can be driven three-dimensionally.

Figure 21:
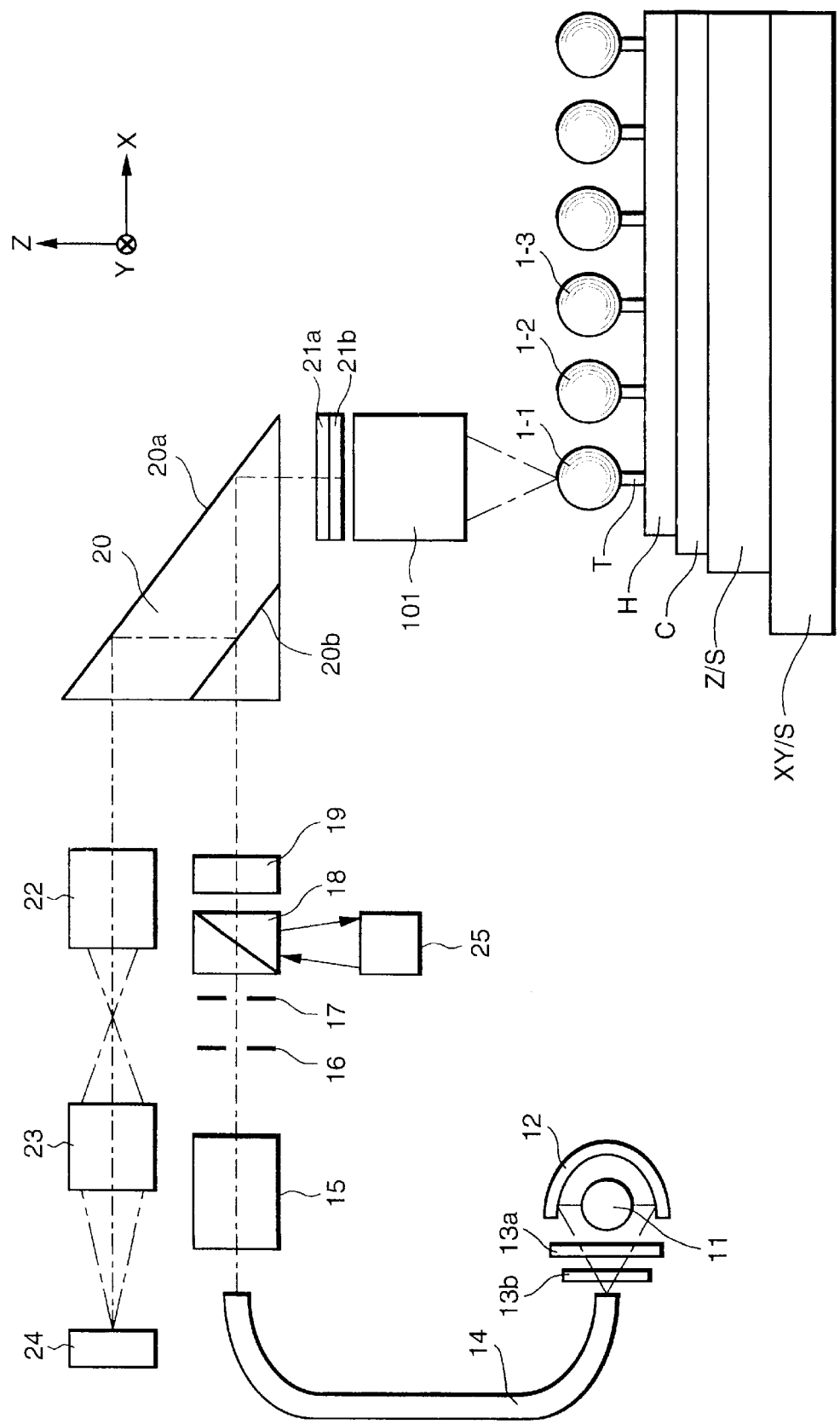
FIG. 21 is a view showing the state of detecting the three-dimensional position of a reference mark near the top of the silicon ball by the three-dimensional position detector 3AS in an alignment station.
Figure 22:
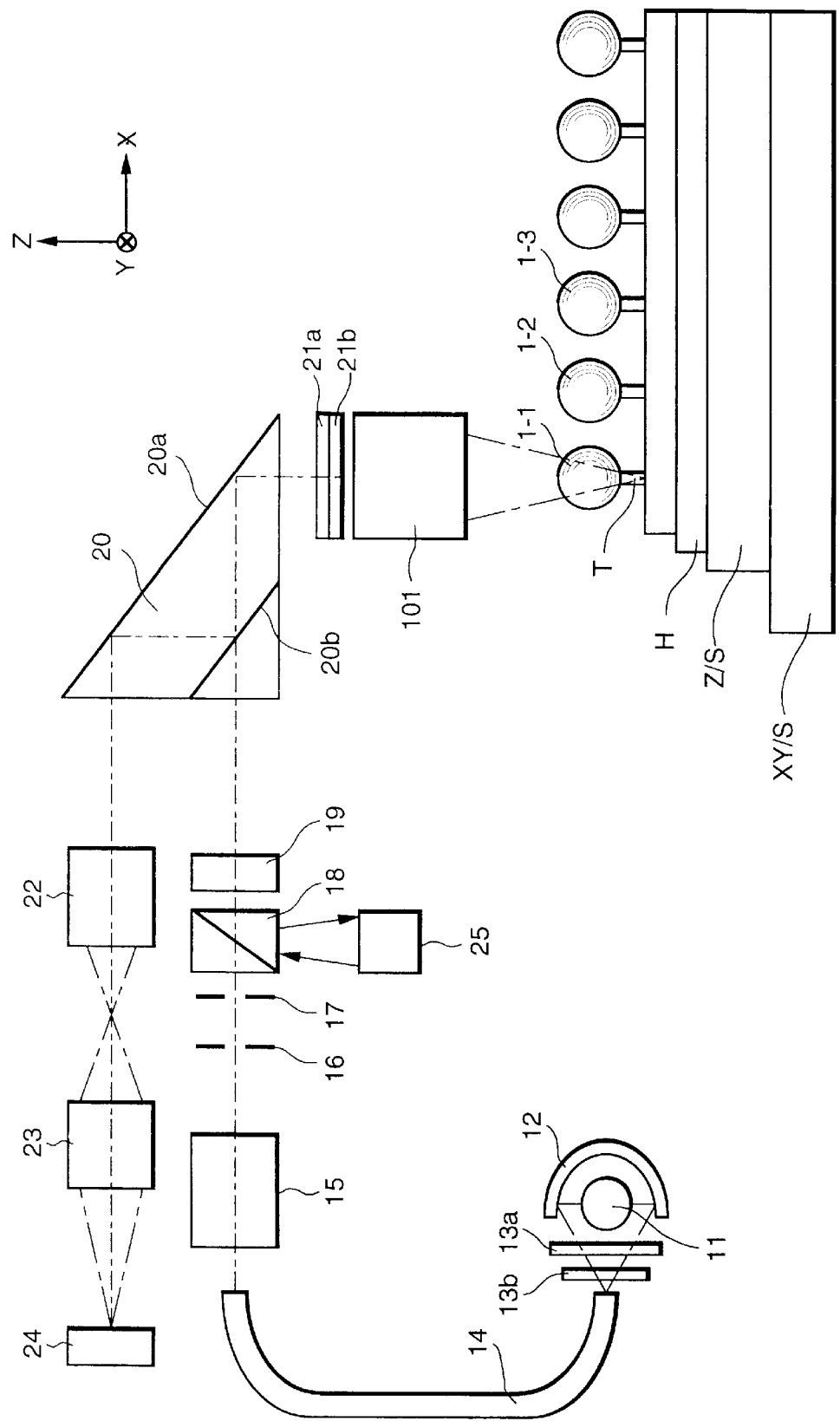
FIG. 22 is a view showing the state of detecting the three-dimensional positions of reference marks formed on the two sides of the tee of the holder by the three-dimensional position detector 3AS in the alignment station.

At least two three-dimensional position detectors 3AS are arranged near the holding position of the reticle 2. Note that FIG. 1 shows only one three-dimensional position detector 3AS, but another three-dimensional position detector 3AS is practically arranged in the y direction on the coordinate shown in FIG. 1. This three-dimensional position detector 3AS can have, e.g., the same structure as that of a three-dimensional position detector 3AS in an alignment station AS shown in FIGS. 21 and 22.

Figure 9:
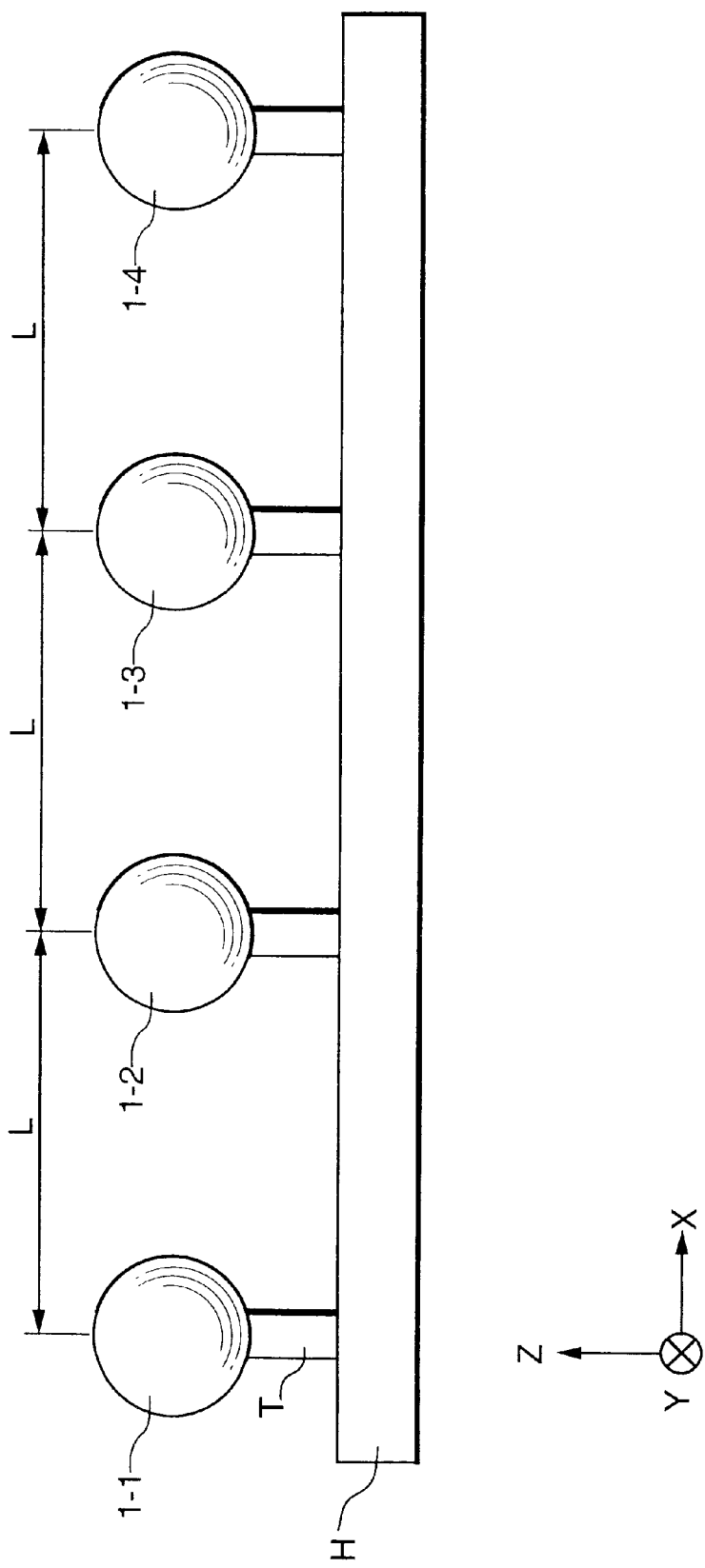
FIG. 9 is a view showing a holder tee-up-chucking a plurality of silicon balls.
Figure 10:
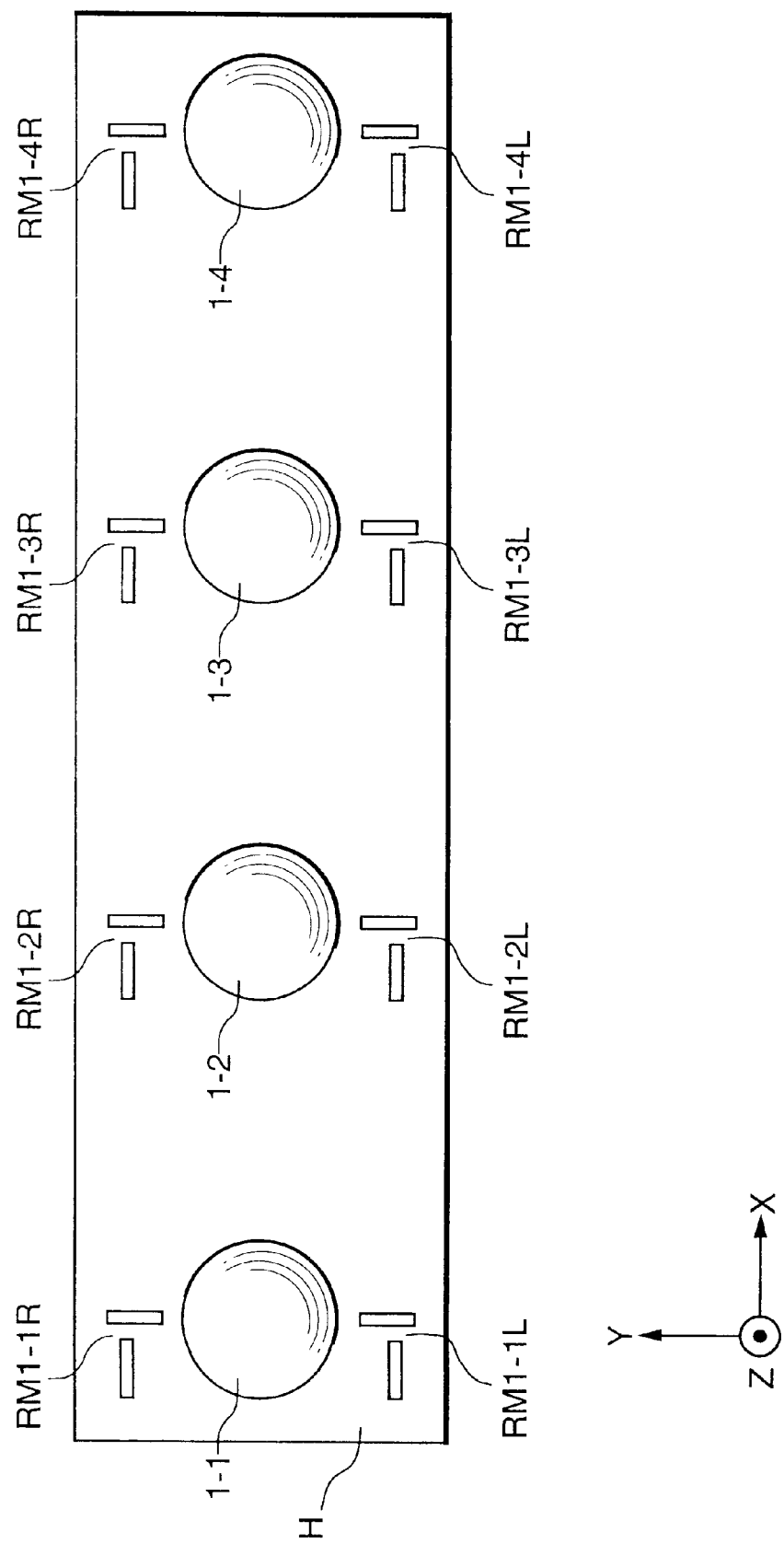
FIG. 10 is a view showing position detection reference marks formed on the holder.

FIG. 9 shows the holder H tee-up-chucking the four silicon balls 1 by the tees T at an interval L. FIG. 10 is a view of the holder H shown in FIG. 9 when viewed from the exposure light source 5. Reference numerals 1-1, 1-2, 1-3, and 1-4 denote silicon balls 1.

Figure 11:
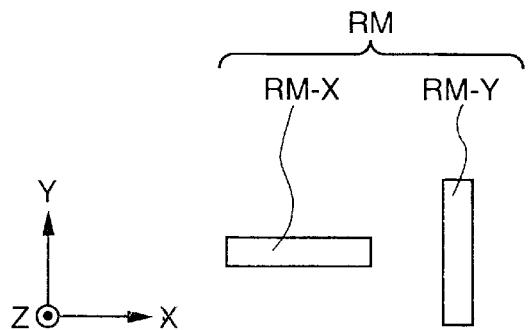
FIG. 11 is an enlarged view of each reference mark shown in FIG. 10.

As shown in FIG. 10, reference marks RM are formed on the surface (surface on the exposure light source 5 side) of the holder H so as to be positioned on the two sides of each silicon ball 1. In FIG. 10, the reference marks are denoted by reference symbols RM1-1R, RM1-1L, . . . in order to discriminate the reference marks RM. FIG. 11 is an enlarged view of one reference mark RM. Each reference mark RM is made up of two types of marks, i.e., a mark RM-X for measuring a shift in the x direction and a mark RM-Y for measuring a shift in the y direction.

Figure 12:
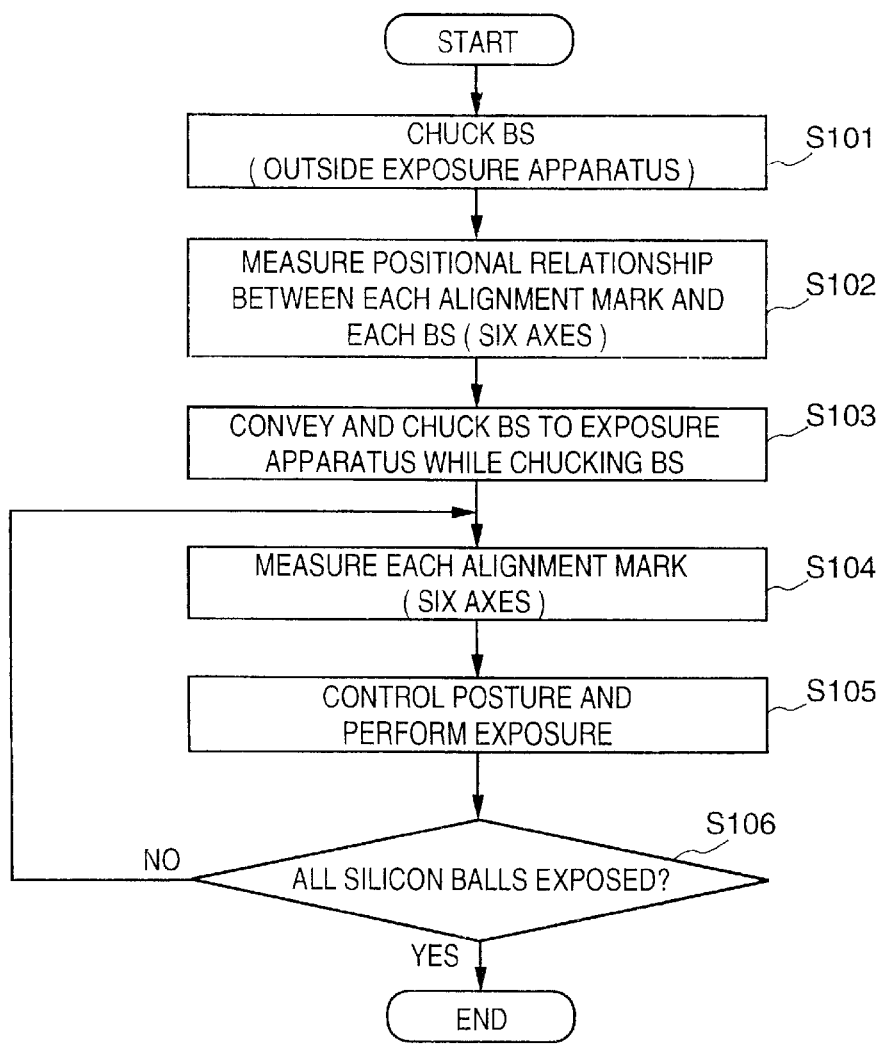
FIG. 12 is a flow chart for explaining alignment and exposure sequences.

The alignment and exposure sequences will be explained with reference to FIG. 12.

In step S101, a plurality of silicon balls 1 are tee-up-chucked by the tees T of the holder H outside the exposure apparatus. In FIG. 12, BS represents the silicon ball.

In step S102, the three-dimensional positional relationship between each silicon ball 1 and the reference marks RM on the holder H that are positioned on the two sides of the silicon ball 1 is measured, and the measurement results are stored. In the following alignment control, the results are used to align the holder H. Note that the three-dimensional positional relationship is measured for six axes, i.e., positions in the x, y, and z directions and rotation angles around the x, y, and z axes.

In step S103, while each silicon ball 1 is tee-up-chucked by a corresponding tee T of the holder H, the holder H is conveyed to the exposure apparatus and chucked and held by the chuck C.

Figure 14:
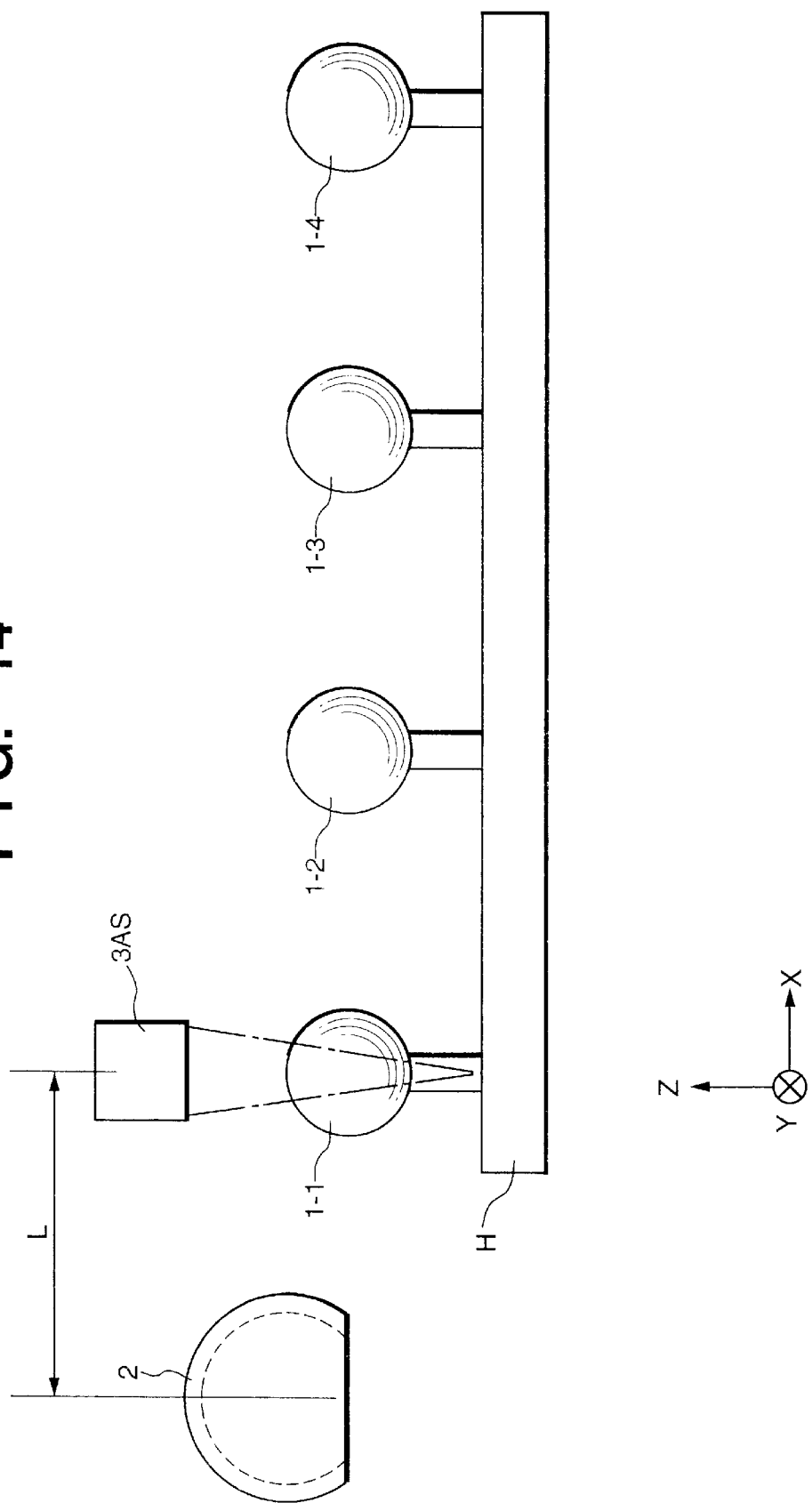
FIG. 14 is a view showing the state of detecting the position of a reference mark on the holder that corresponds to the first silicon ball.

In step S104, as shown in FIG. 14, three-dimensional positional measurement is performed for only the reference mark RM of the holder H. Note that the three-dimensional positional measurement is performed for six axes, i.e., positions in the x, y, and z directions and rotation angles around the x, y, and z axes.

In step S105, a correction value is derived from the measurement results in steps S102 and S104, and control data for the respective stages are corrected based on this correction value. The holder H is moved to an exposure execution position by the X-Y stage XY/S with the laser interferometer and the Z stage Z/S on the basis of the corrected control data, and then exposure is executed (see FIGS. 14 to 17).

In step S106, whether all the silicon balls 1 have been exposed is checked. If NO in step S106, the flow returns to step S104 to execute steps S104 and S105 for the next silicon ball 1 to be exposed. If YES in step S106, a series of processes end.

Since the positional relationships with the reference mark RM on the holder H are measured for all the silicon balls 1 in step S102 in the above manner, a high throughput can be obtained.

FIGS. 13 to 20 show steps S103 to S106, i.e., the steps of fixing the holder H tee-up-chucking the silicon balls 1 to the chuck C, aligning the holder H with respect to the exposure apparatus by the two three-dimensional position detectors 3AS, and executing exposure. FIGS. 21 and 22 show steps S101 and S102, i.e., the steps of detecting the positional relationship between each silicon ball 1 and the holder H.

Figure 13:
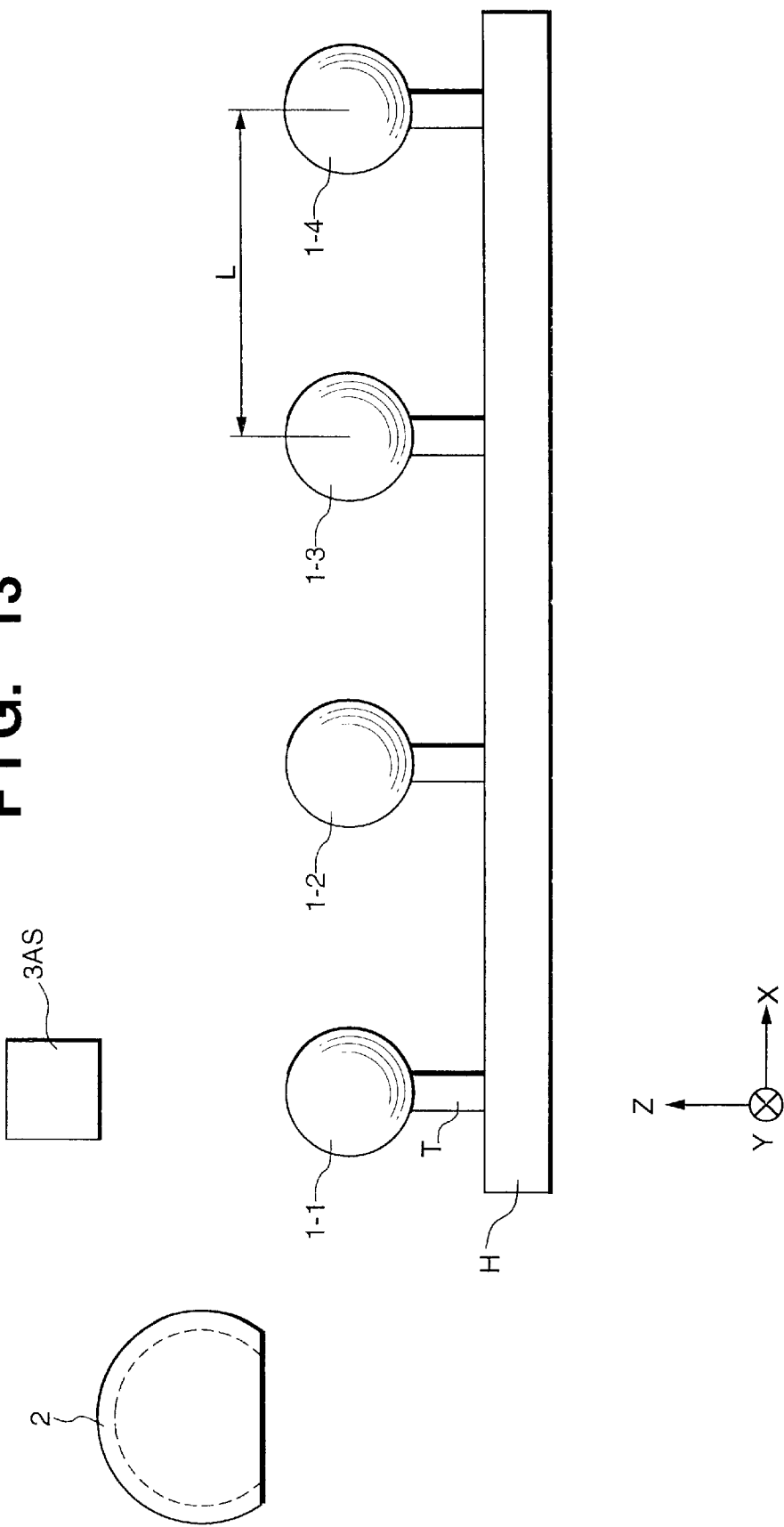
FIG. 13 is a view showing the positional relationship between the holder and the exposure apparatus when the holder is set at the start position.

After the holder H is fixed to the chuck C (step S103), the holder H is moved to the start position, i.e., the position where the first silicon ball 1-1 faces an alignment scope serving as the three-dimensional position detector 3AS, as shown in FIG. 13.

Figure 23:
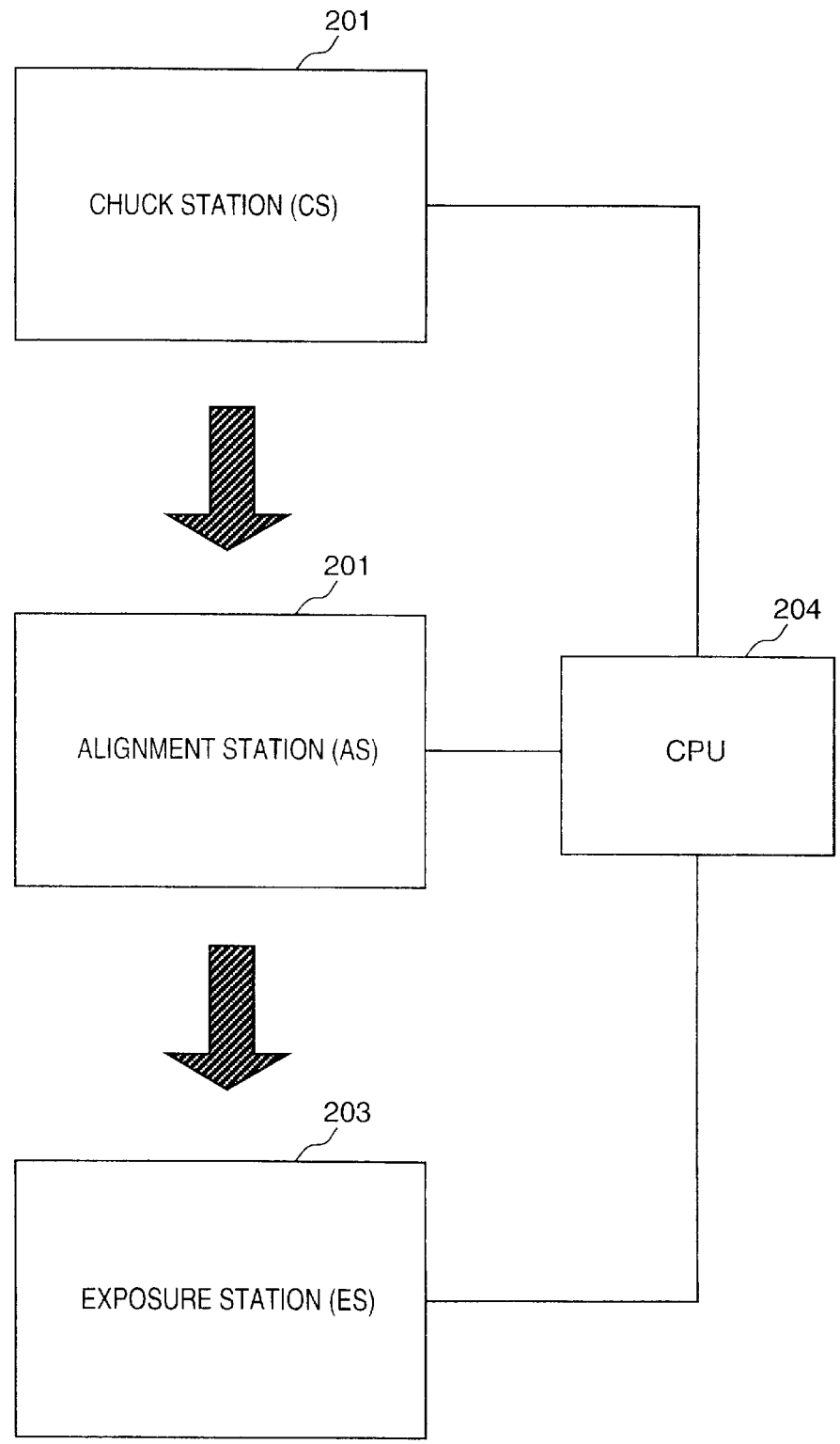
FIG. 23 is a view schematically showing a system for chucking the silicon ball by the tee of the holder, obtaining the positional relationship between the holder and the silicon ball, and executing exposure.

As shown in FIG. 14, the holder H is moved in the positive direction of the z-axis, i.e., the direction to bring the silicon ball 1-1 close to the three-dimensional position detectors 3AS until the two three-dimensional position detectors 3AS can detect the positions of two reference marks RM1-1L and RM1-1R for aligning the silicon ball 1-1. In this state, the two three-dimensional position detectors 3AS simultaneously detect the three-dimensional positions of the reference marks RM1-1L and RM1-1R (step S104). Note that the three-dimensional position detection may employ a position detecting method in an alignment station 202 (to be described later; FIGS. 21 to 23).

Figure 15:
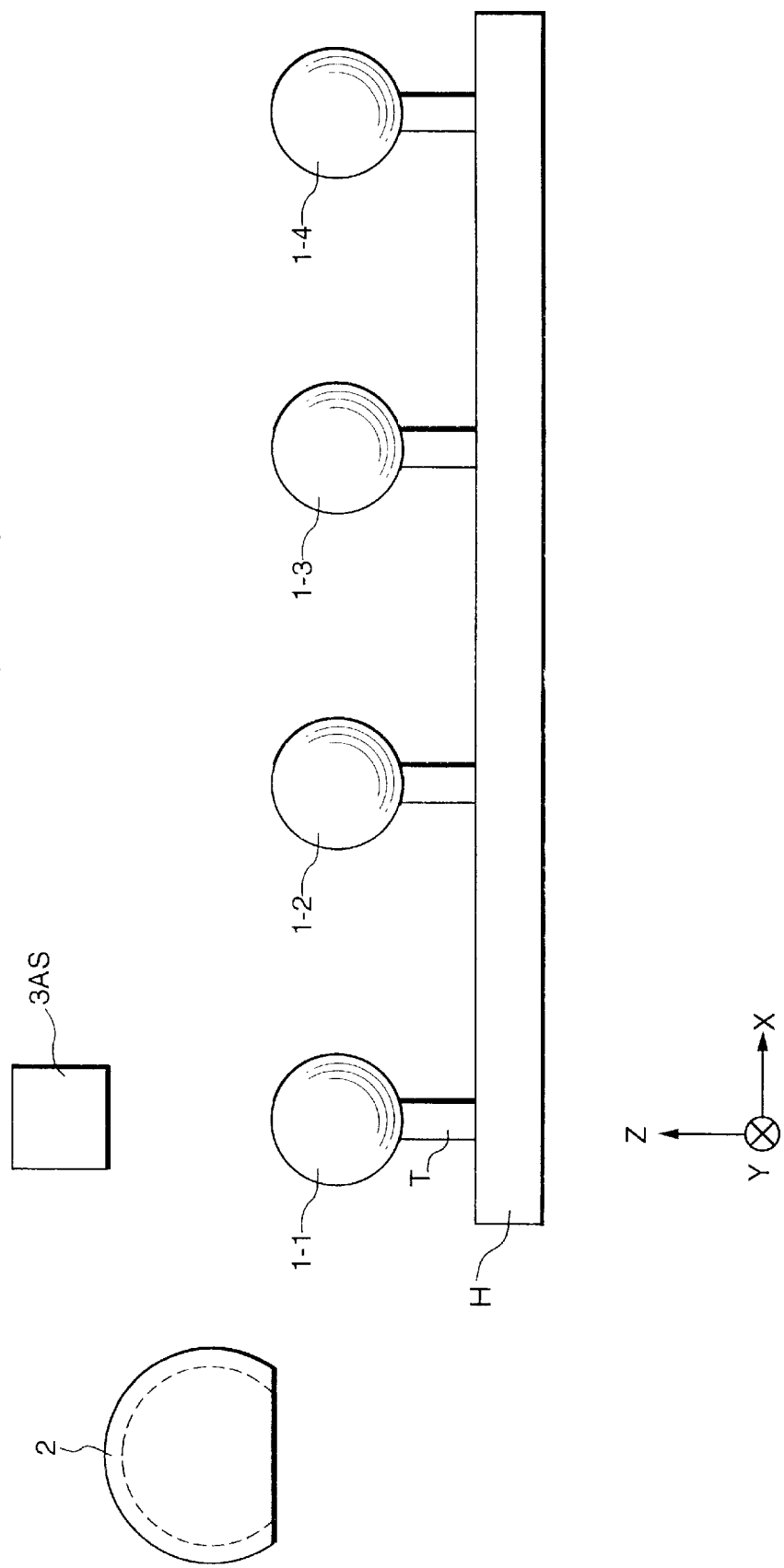
FIG. 15 is a view showing the state of moving the first silicon ball away from a three-dimensional position detector 3AS.

As shown in FIG. 15, the holder H is moved in the negative direction of the z-axis, i.e., the direction to move the silicon ball 1-1 apart from the three-dimensional position detectors 3AS.

Figure 16:
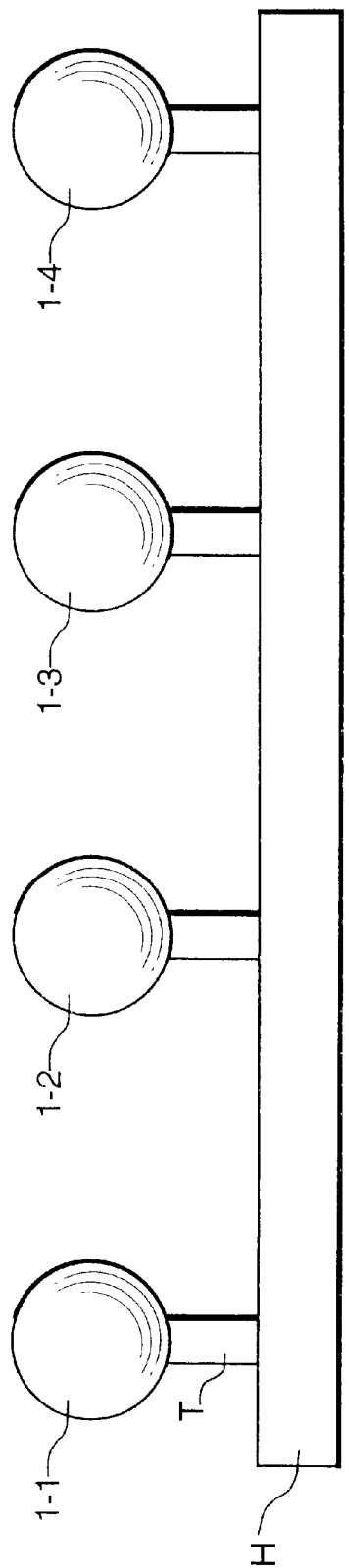
FIG. 16 is a view showing the state of making the first silicon ball face a reticle 2.

As shown in FIG. 16, the holder H is moved in the negative direction of the x-axis to the position where the first silicon ball 1-1 faces the reticle 2.

Figure 17:
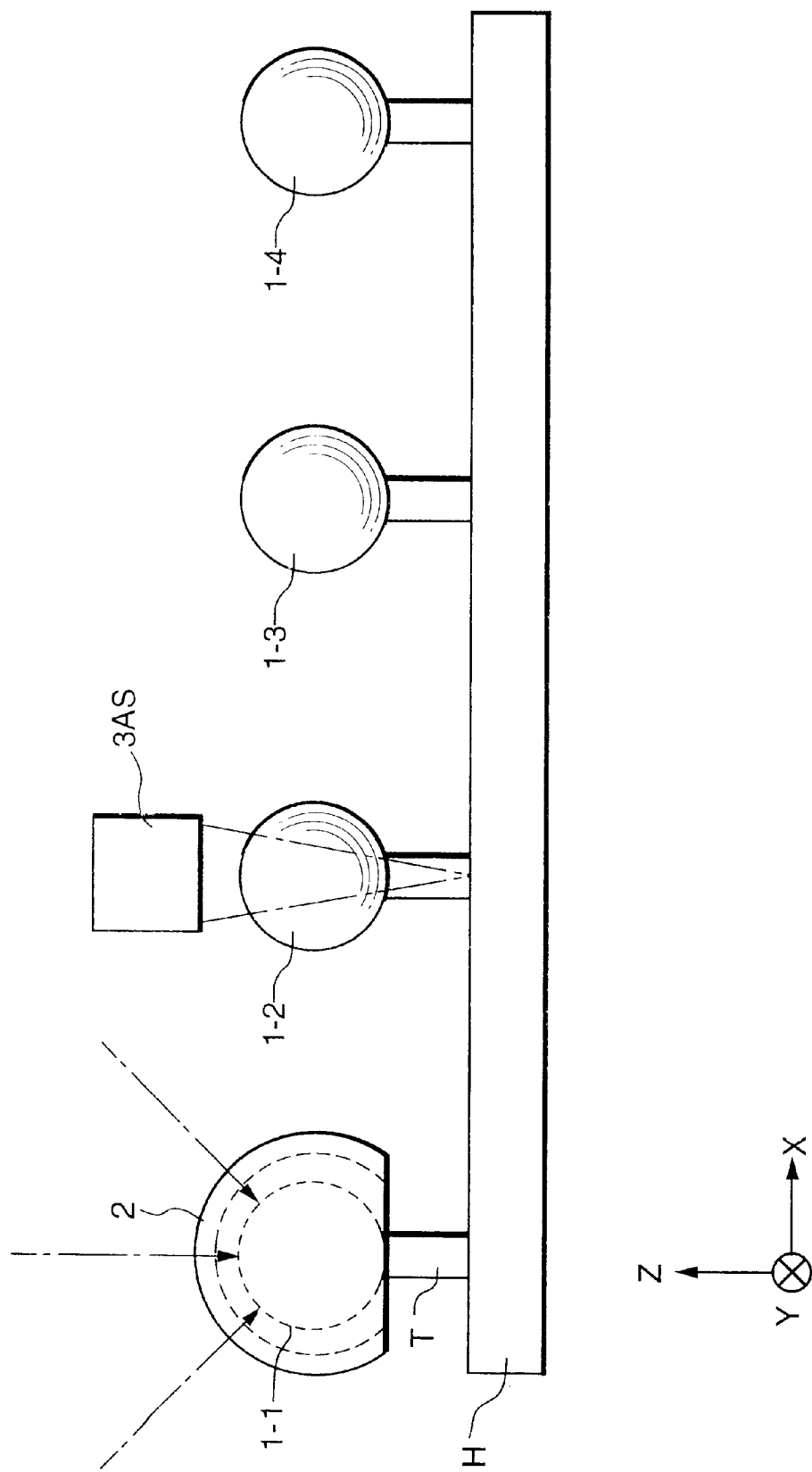
FIG. 17 is a view showing the state of exposing the first silicon ball and detecting the position of a reference mark on the holder that corresponds to the second silicon ball.

As shown in FIG. 17, the holder H is moved in the positive direction of the z-axis until the center of the first silicon ball 1-1 coincides with the center of the reticle 2. The moving amount of the holder H is determined by control data reflecting the correction value derived from the measurement results in steps S102 and S104. In this state, a desired circuit pattern is exposed on the first silicon ball 1-1 (step S105).

If a distance L (see FIG. 14) between the three-dimensional position detector 3AS and the reticle 2 is set equal to the arrangement interval L (see FIG. 13) between the silicon balls 1, the three-dimensional positions of reference marks RM1-2L and RM1-2R for aligning the second silicon ball 1-2 can be detected simultaneously when the circuit pattern is exposed on the first silicon ball 1-1.

An allowable error for the distance (L in FIG. 14) between the three-dimensional position detector 3AS and the reticle 2 and the arrangement interval (L in FIG. 13) between the silicon balls 1 is defined as follows. That is, the detectable range of the three-dimensional position detector 3AS in the x and y directions is set larger than the sum of an error generated in chucking each silicon ball 1 by the tee T, a formation error generated in forming an attachment portion for the tee T on the holder H, an attachment error generated in attaching the tee T to the holder H, and an error (also including a change with time) of the distance between the three-dimensional position detector 3AS and the reticle 2. In short, the three-dimensional position detector 3AS can only measure the positions of reference marks for a next silicon ball 1 during exposure of one silicon ball 1.

Figure 18:
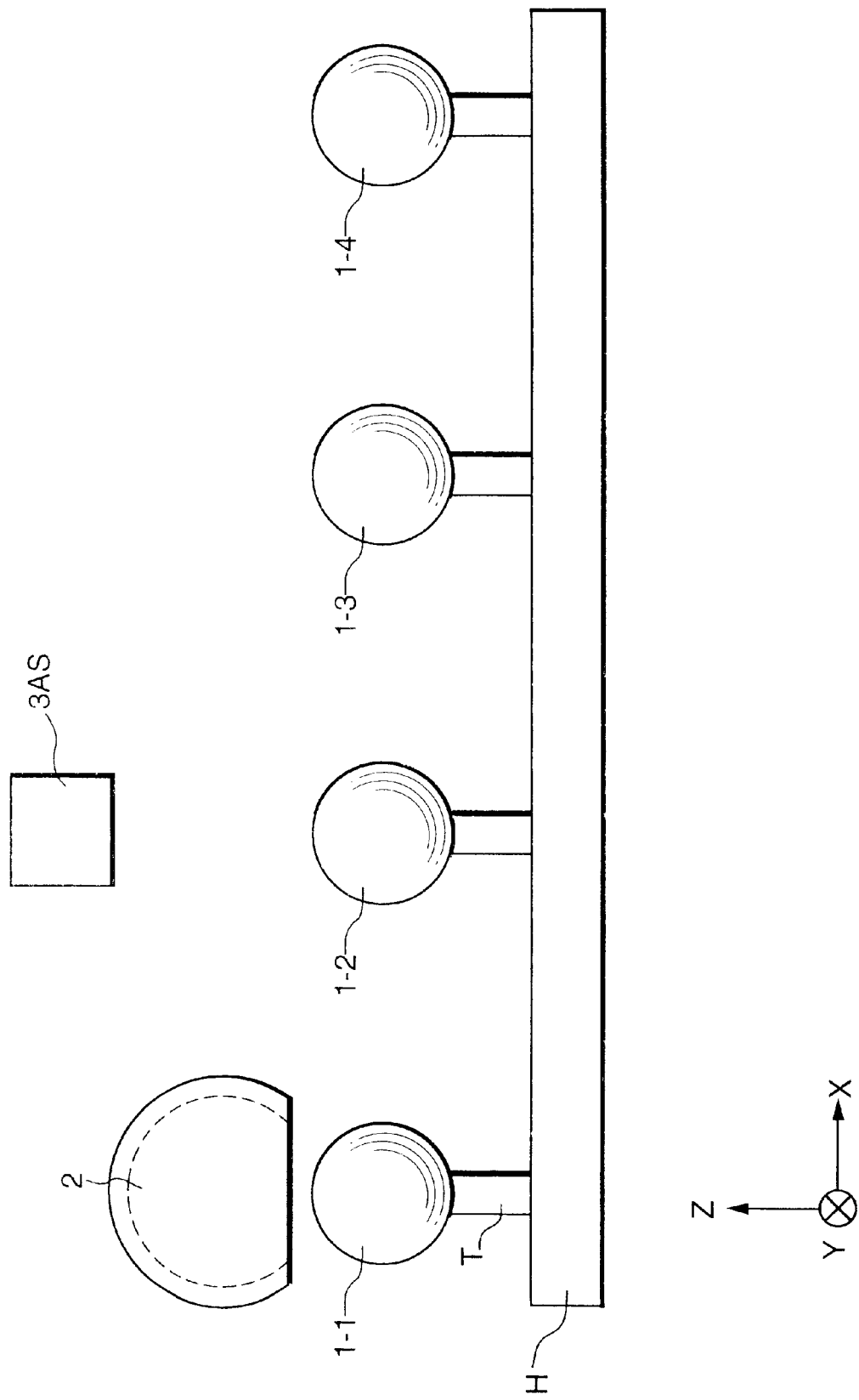
FIG. 18 is a view showing the state of moving the first and second silicon balls away from the reticle and the three-dimensional position detector, respectively.

Upon completion of the exposure of the first silicon ball 1-1 and the detection of the reference marks for the second silicon ball 1-2 in the above manner, the holder H is moved in the negative direction of the z-axis, i.e., the direction to move the silicon ball 1-1 apart from the reticle 2, as shown in FIG. 18.

Figure 19:
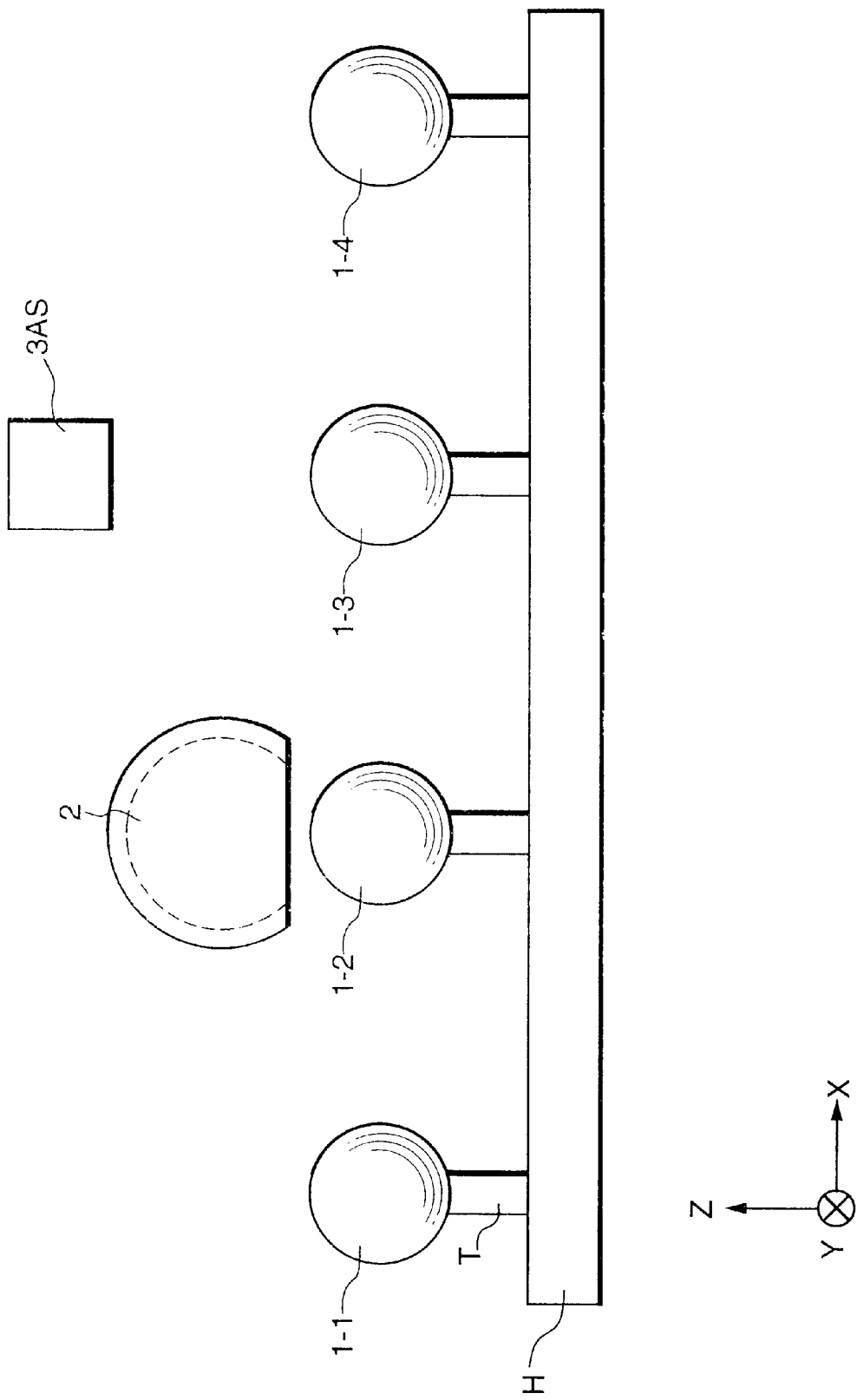
FIG. 19 is a view showing the state of making the second silicon ball face the reticle.

As shown in FIG. 19, the holder H is moved in the negative direction of the x-axis until the second silicon ball 1-2 faces the reticle 2, in other words, to the position where the third silicon ball 1-3 faces the three-dimensional position detector 3AS.

Figure 20:
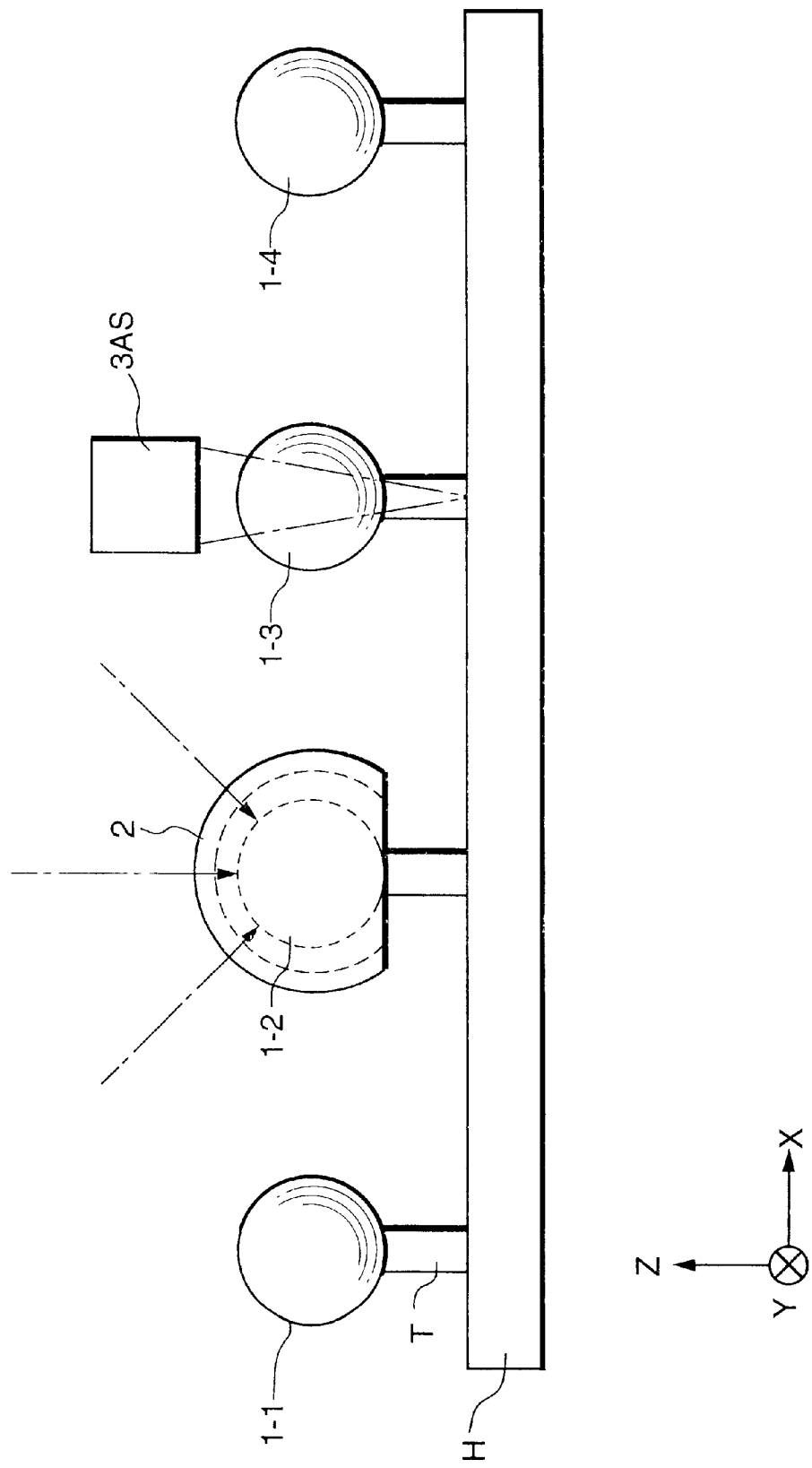
FIG. 20 is a view showing the state of exposing the second silicon ball and detecting the position of a reference mark on the holder that corresponds to the third silicon ball.

As shown in FIG. 20, the holder H is moved in the positive direction of the z-axis until the center of the second silicon ball 1-2 coincides with the center of the reticle 2. In this state, the desired circuit pattern is exposed on the second silicon ball 1-2, while the three-dimensional positions of reference marks RM1-3L and RM1-3R for the third silicon ball 1-3 are detected by the three-dimensional position detector 3AS.

By repeatedly executing the above sequence, a plurality of silicon balls 1 can be successively aligned and exposed.

The processing in step S102, i.e., the method of obtaining the three-dimensional positional relationship between the holder H (more specifically, the reference mark) and the silicon ball 1 will be explained.

FIG. 23 is a view schematically showing a system for chucking the silicon ball 1 by the tee T of the holder H, obtaining the positional relationship between the holder H and the silicon ball 1, and executing exposure. A chuck station (CS) 201 is a station for chucking the silicon ball 1 by the tee T of the holder H. The alignment station (AS) 202 is a station for obtaining the positional relationship between the silicon ball 1 on the tee T and the holder H. An exposure station (ES) 203 is a station (exposure apparatus shown in FIG. 1) for executing exposure.

Prior to the execution of exposure, a photoresist or the like as a photosensitive material is applied on the surfaces of a plurality of silicon balls 1. In the chuck station (CS) 201, to make preparation for exposure, the silicon balls 1 are placed on the tees T of the holder H and supported by the tees T by vacuum chucking or electrostatic chucking. The holder H supporting the silicon balls 1 can be directly moved to the alignment station (AS) 202 and the exposure station (ES) 203.

In the first embodiment, the precision required to chuck the silicon ball 1 by the tee T of the holder H is set such that errors of the rotation components around the three-dimensional (x, y, and z) axes fall within a negligible range in terms of the relationship with the precision required to form a pattern on the silicon ball 1. In this case, alignment processing in the exposure apparatus is facilitated because alignment along only the x-, y-, and z-axes is considered.

The holder H supporting the silicon balls 1 is conveyed to the alignment station (AS) 202. The alignment station (AS) 202 comprises the X-Y stage and the Z stage capable of three-dimensionally driving the holder H, and at least one three-dimensional position detector 3AS. In the case using driving of the holder H by the stages, only one three-dimensional position detector 3AS is arranged commonly to detect the total of three reference marks, i.e., one reference mark formed near the top of the silicon ball 1 and two reference marks on the two sides of the tee T of the holder H. In the case not using driving of the holder H by the stages, three three-dimensional position detectors 3AS are arranged to detect the respective reference marks.

FIGS. 21 and 22 are views showing the state of detecting the three-dimensional relative positional relationship between the silicon ball chucked by the tee T of the holder H and the reference marks formed on the holder H in the alignment station (AS) 202. FIG. 21 schematically shows the state of detecting the three-dimensional position of the reference mark near the top of the silicon ball 1-1 by the three-dimensional position detector 3AS in the alignment station (AS) 202. FIG. 22 schematically shows the state of detecting the three-dimensional positions of the reference marks formed on the two sides of the tee T of the holder H by the three-dimensional position detector 3AS in the alignment station (AS) 202.

The principle of three-dimensional position detection by the three-dimensional position detector 3AS arranged in the alignment station (AS) 202 will be explained below.

Of a beam emitted by a halogen lamp 11 and a beam reflected by a reflecting mirror 12, a beam having a wavelength selected by wavelength selecting filters 13a (long-wavelength side) and 13b (short-wavelength side) is incident on a fiber 14. The beam through the exit end of the fiber 14 passes through a condenser lens 15, an aperture stop 16, a field stop 17, a dichroic mirror 18, an illumination system lens 19, a prism 20, a quarter-wave plate (made up of 21b and 21b), and an objective lens 101.

When the position of the silicon ball 1-1 is to be detected, the beam passing through the objective lens 101 illuminates the reference mark (e.g., a mark having the same shape as the reference mark RM shown in FIG. 11 can be used) near the top of the silicon ball 1-1, as shown in FIG. 21. When the position of the holder H is to be detected, the beam passing through the objective lens 101 illuminates the reference mark RM1-1L (RM1-1R) on the holder H, as shown in FIG. 22.

The beam reflected by the reference mark on the silicon ball 1-1 or the reference mark RM1-1L (RM1-1R) formed on the holder H changes in polarized state through the objective lens 101 and the quarter-wave plate (made up of 21a and 21b). The beam is reflected by surfaces 20a and 20b of the prism 20 and formed into an image on a two-dimensional image sensing element 24 such as a CCD camera through a relay lens 22 and an erector lens 23. In the two-dimensional image sensing element 24, positional shifts of the holder H in the x and y directions are detected on the basis of the image position of the reference mark near the top of the silicon ball 1 or the image positions of the reference marks RM1-1L and RM1-1R formed on the two sides of the silicon ball 1 on the holder H.

As a so-called image processing alignment method of photoelectrically converting the image of the mark, e.g., the method disclosed in Japanese Patent Laid-Open No. 3-61820 is used. This method is a technique whose effects and functions have been confirmed by practical products.

The principle of detecting the position in the z direction by the three-dimensional position detector shown in FIGS. 21 and 22 will be explained.

A beam emitted by a z-direction detecting unit 25 is reflected by the dichroic mirror 18 and passes through the illumination system lens 19, the prism 20, the quarter-wave plate (made up of 21b and 21b), and the objective lens 101. When the position of the silicon ball 1 is to be detected, the beam passing through the objective lens 101 illuminates the reference mark near the top of the silicon ball 1, as shown in FIG. 21. When the position of the holder H is to be detected, the beam passing through the objective lens 101 illuminates the reference mark RM1-1L (RM1-1R) on the holder H, as shown in FIG. 22.

The beam reflected by the reference mark formed on the silicon ball 1 or on the holder H is incident on the surfaces 20a and 20b of the prism 20 through the objective lens 101 and the quarter-wave plate (made up of 21a and 21b). The surfaces 20a and 20b of the prism 20 function as a polarization beam splitter for the xy-direction position detection wavelength described above, and have characteristics of transmitting light for the z-direction position detection wavelength.

The beam transmitting through the prism 20 is reflected by the dichroic mirror 18 to be incident on the z-direction detecting unit 25. By detecting a positional shift of the beam on the sensor, the position in the z direction is detected.

When the alignment station (AS) 202 comprises only one three-dimensional position detector 3AS, for example, the three-dimensional position of the reference mark RM1-1L on the left side of the silicon ball 1-1 is detected, and then the X-Y stage XY/S is moved along the y-axis to detect the three-dimensional position of the right reference mark RM1-1R.

By the above processing, the three-dimensional relative positional relationship between the holder H and the silicon ball 1-1 can be obtained. By repeatedly executing this processing for the silicon ball 1-2 and subsequent silicon balls, the three-dimensional relative positional relationships between a plurality of silicon balls 1 chucked by the holder H and the holder H (more specifically, corresponding reference marks RM) can be obtained. The positional relationships obtained in this manner are stored in the memory of a CPU 204. The holder H is conveyed from the alignment station (AS) to the exposure station (ES) 203 while tee-up-chucking a plurality of silicon balls 1. In the exposure station (ES) 203, exposure is executed while each silicon ball 1 is aligned on the basis of information about the positional relationship stored in the memory.

When the alignment station (AS) 202 comprises another three-dimensional position detector 3AS along the y-axis in FIGS. 21 and 22, the three-dimensional positions of the reference marks RM (e.g., RM1-1L and RM1-1R) on the two sides of each silicon ball 1 can be detected without driving the X-Y stage XY/S in the y direction.

Although the hologram described above is curved in correspondence with the spherical surface of the ball-like device material, a flat hologram can also be adopted as long as a curved circuit pattern can be formed on the spherical surface of the ball-like device material.

As the above hologram, a hologram formed by a kinoform considered as one kind of computer generated hologram can be employed. The kinoform is "a computer generated hologram implemented to realize a phase hologram with the highest efficiency" (Takanori Okoshi, "Holography", the Institute of Electronics and Communication Engineers of Japan, p. 204).

The three-dimensional position detector 3AS shown in FIGS. 21 and 22 employs the image processing method as a position detecting method in the x and y directions. However, the present invention is not limited to this. As another method, a method of relatively scanning a laser beam or a heterodyning interference method is suitable. If no reference mark is used, the same effects as those described above can be attained by adopting a position detecting method capable of two-dimensionally measuring the relative positional relationship between the silicon ball and the reference mark on the holder.

The three-dimensional position detector 3AS shown in FIGS. 21 and 22 employs the method of detecting a positional shift of the beam as a position detecting method in the z direction. However, the present invention is not limited to this. As another method, an astigmatism method of detecting a change in shape of the beam or a method using an electrostatic capacitance sensor is available.

As the three-dimensional position detecting method in the alignment station (AS) and the exposure station (ES), another detecting method may be adopted.

In the exposure apparatus (exposure station ES) shown in FIG. 1, the three-dimensional position of each reference mark formed on the holder H in correspondence with each ball-like device material is measured. However, the present invention is not limited to this. For example, a method of detecting the positions of at least two reference marks on the holder may be employed. In this case, six-axis position control is performed for each silicon ball in the exposure station (ES) on the basis of the relative positional relationship between the silicon ball and the reference marks on the holder that is obtained in the alignment station (AS).

The first embodiment has exemplified the case wherein the alignment station (AS) comprises one alignment scope as a three-dimensional position detector (which uses stage driving, sequentially detects the total of three reference marks, i.e., one reference mark near the top of the silicon ball and two reference marks on the two sides of the silicon ball on the holder H, and recognizes the relative positional relationship between the silicon ball and the holder H), and the exposure station (ES) comprises two alignment scopes (which do not use stage driving, simultaneously detect the reference marks on the two sides of the silicon ball on the holder, and recognize the relative positional relationship between the holder H and the exposure apparatus). This arrangement is, however, merely an example. For example, when m silicon balls are processed at once, m alignment scopes may be arranged in the alignment station (AS), and 2m alignment scopes may be arranged in the exposure station (ES).

The first embodiment has also exemplified the case wherein the alignment station (AS) comprises three alignment scopes (which do not use stage driving, simultaneously detect the total of three reference marks, i.e., one reference mark near the top of the silicon ball and two reference marks on the two sides of the silicon ball on the holder H, and recognize the relative positional relationship between the silicon ball and the holder H), and the exposure station (ES) comprises two alignment scopes (which do not use stage driving, simultaneously detect the reference marks on the two sides of the silicon ball on the holder, and recognize the relative positional relationship between the holder H and the exposure apparatus). This arrangement is, however, merely an example. For example, when m silicon balls are to be processed at once, 3m alignment scopes may be arranged in the alignment station (AS), and 2m alignment scopes may be arranged in the exposure station (ES).

As described above, according to the preferred embodiment of the present invention, a circuit pattern can be transferred to a wide region of the spherical surface of the silicon ball 1 with a high throughput.

Second Embodiment

In the system according to the first embodiment, the surface of the reticle 2 is preferably spherical. In this case, however, some problems arise. For example, the design difficulty of the reticle 2 is high, the cost of the reticle 2 is high, and the precision of a formed pattern is decreased by a shape error of the reticle 2.

The second embodiment discloses an apparatus and method of exposing a pattern on the surface of a ball-like device material without using any spherical reticle.

Figure 24:
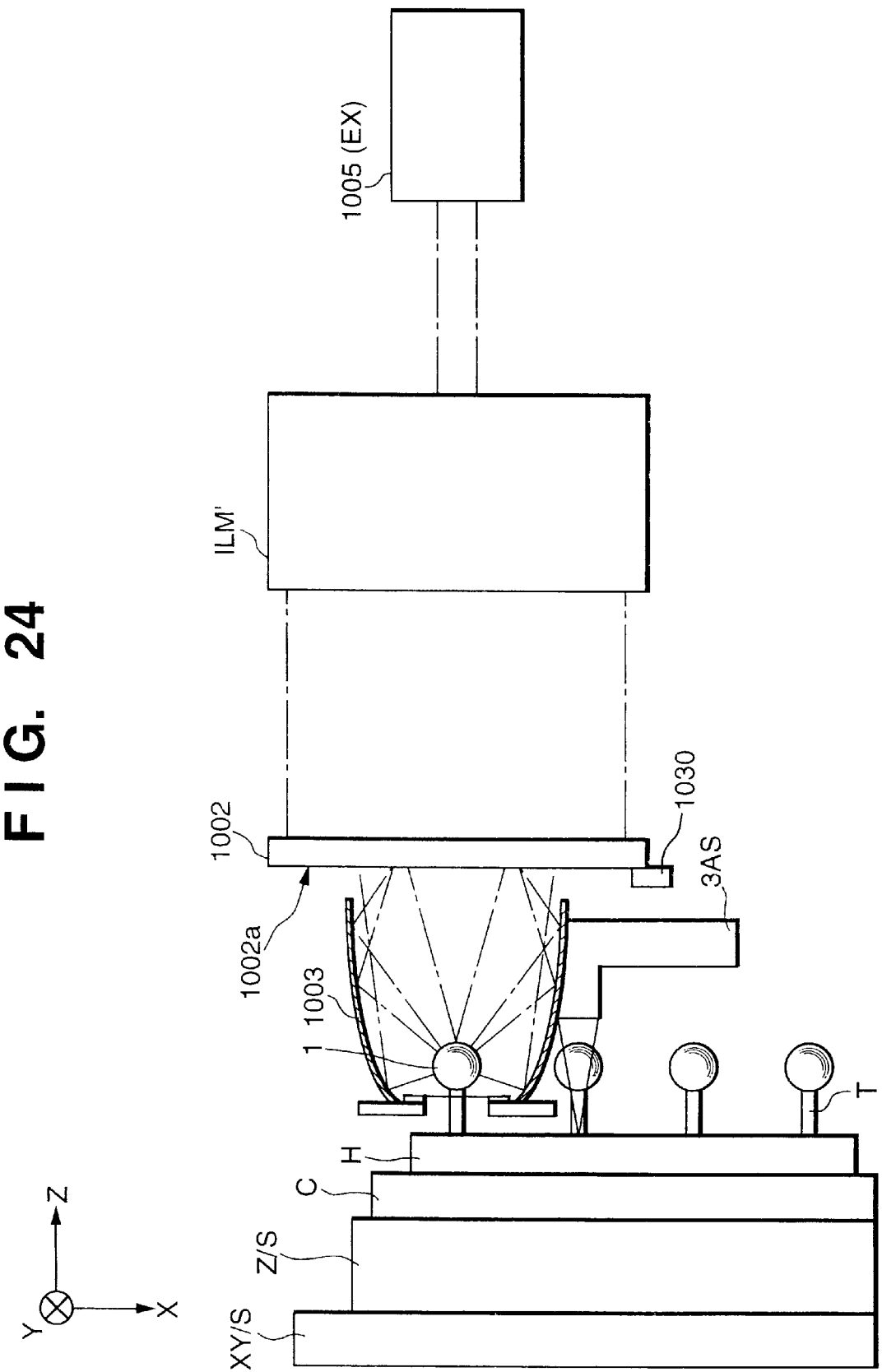
FIG. 24 is a view schematically showing an exposure apparatus according to the second embodiment of the present invention.

FIG. 24 is a view showing the schematic arrangement of the exposure apparatus according to the second preferred embodiment of the present invention. This exposure apparatus can expose a pattern on a half or more region of the entire spherical surface of a silicon ball 1 at once.

A reticle 1002 has a flat outer shape, and comprises a pattern surface 1002a on which a kinoform is formed. A reproduced pattern of this kinoform forms a circuit pattern to be transferred to the surface of the silicon ball 1.

The exposure apparatus comprises a parabolic mirror (or elliptic mirror) 1003 in order to transfer a circuit pattern to almost the entire surface of the silicon ball 1 at once. This mirror 1003 guides reproduction light through the kinoform pattern surface 1002a to the backside surface (opposite to an exposure light source 1005) of the silicon ball 1.

The kinoform pattern surface 1002a is a kind of phase hologram and is made up of only phase information. Accordingly, the kinoform pattern surface 1002a undesirably forms a (noisy) reproduced image including a noise component without any processing. To solve this problem, various methods are proposed. According to, e.g., "Oplus E, 11/1996, p. 83", the optimum algorithms are 1) simulated annealing 2) genetic algorithm 3) Fourier iterative algorithm By these methods, a kinoform having an efficiency of 100% can be theoretically obtained. To use the kinoform in the second embodiment, however, several new evaluation criteria are preferably added: telecen conditions and conditions for illuminance irregularity.

Figure 25:
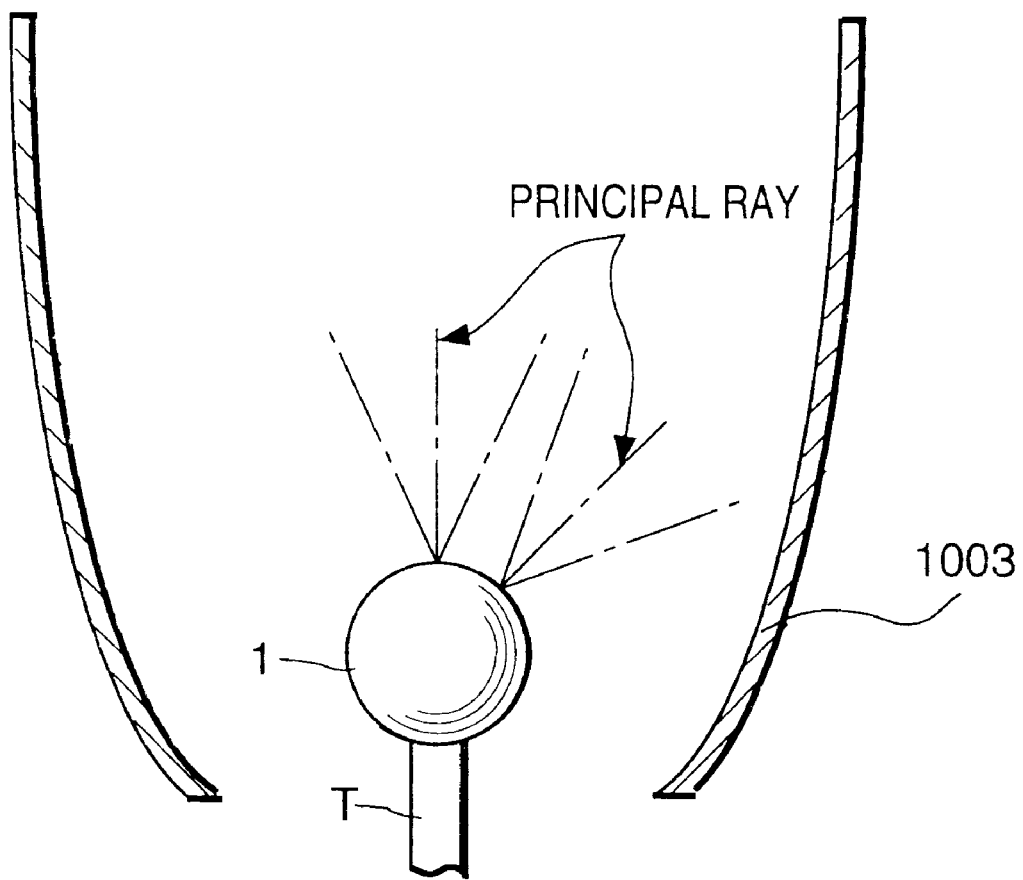
FIG. 25 is a view for explaining telecen conditions.

The telecen conditions will be first described. As shown in FIG. 25, kinoform reproduction light strikes respective points on the surface of the silicon ball 1 to form a desired circuit pattern. The principal ray (central beam of exposure light beams) striking each point must be perpendicular to the point on the surface of the silicon ball 1, which is called the telecen conditions. If the principal ray (the central beam of the exposure light beams) inclines with respect to the point, the sensitivity of the resist on the silicon ball 1 changes, and in addition the magnification changes depending on a change in dimension of the outer shape of the silicon ball 1.

The illuminance irregularity will be explained. If the illuminance irregularity occurs, exposure conditions become nonuniform on the surface of the silicon ball 1 to fail to uniformly form a pattern. For this reason, when optimization is performed by the genetic algorithm, the telecen conditions and the conditions about the illuminance irregularity must be satisfied as evaluation items of high priority, whereas the priority of the efficiency is decreased.

In particular, to meet demands for the illuminance irregularity, optimization is performed such that light is diffracted by the kinoform to outside the NA (aperture for passing through exposure light) used in exposure so as to prevent the light through the reticle 1002 from striking the entire surface of the silicon ball 1.

Alignment and exposure sequences according to the preferred embodiment of the present invention will be described.

In this exposure apparatus, a plurality of silicon balls 1 are chucked and supported by tees T of a holder H (tee-up chucking). The second embodiment concerns an example of tee-up-chucking four silicon balls 1 by the tees T and exposing them at once.

The holder H has four tees T. While the silicon balls 1 are tee-up-chucked by the tees T, the holder H is conveyed from outside the exposure apparatus and vacuum-chucked and held by a chuck C.

A Z stage Z/S capable of driving the chuck C (silicon ball 1) along the z-axis (optical axis) is arranged below the chuck C, and an X-Y stage XY/S with a laser interferometer that can drive the chuck C within the X-Y plane is arranged below the Z stage Z/S. With this arrangement, the silicon ball 1 can be driven three-dimensionally while being held by the holder H.

This exposure apparatus comprises at least two three-dimensional position detectors 3AS. Note that FIG. 24 shows only one three-dimensional position detector 3AS, but another three-dimensional position detector 3AS is practically arranged in the y direction on the coordinate shown in FIG. 24. This three-dimensional position detector 3AS can have, e.g., the same structure as that of the three-dimensional position detector 3AS in the alignment station AS shown in FIGS. 21 and 22.

The exposure light source 1005 is a light source for generating illumination light, and is preferably an excimer laser. An illumination light system ILM' illuminates the reticle 1002 with exposure light emitted by the exposure light source 1005 so as to satisfy predetermined conditions. A reticle holder 1030 holds the reticle 1002 between the silicon ball 1 and the illumination light source ILM' in a direction perpendicular to the optical axis.

FIG. 9 is an enlarged view showing the holder H tee-up-chucking the four silicon balls 1 (1-1, 1-2, 1-3, and 1-4) at an interval L. FIG. 10 is a view of the holder H shown in FIG. 9 when viewed from the exposure light source 5. As shown in FIG. 10, reference marks RM (RM1-1R, RM1-1L; RM1-2R, RM1-2L; RM1-3R, RM1-3L; RM1-4R, RM1-4L) are formed on the surface of the holder H so as to be positioned on the two sides of each silicon ball 1. FIG. 11 is an enlarged view of the reference mark RM. Each reference mark RM is made up of two types of marks, i.e., a mark RM-X for measuring a shift in the x direction and a mark RM-Y for measuring a shift in the y direction.

The alignment and exposure sequences will be explained with reference to FIG. 26.

In step S1001, a plurality of silicon balls 1 are tee-up-chucked by the tees T of the holder H outside the exposure apparatus. In FIG. 26, BS represents the silicon ball.

In step S1002, the positional relationship between each silicon ball 1 and the reference marks RM on the two sides of the silicon ball 1 is measured. The measurement is performed for six axes, i.e., the x, y, and z axes and rotation components ωx, ωy, and ωz around the respective axes.

In step S1003, while each silicon ball 1 is tee-up-chucked by a corresponding tee of the holder H, the holder H is conveyed to the exposure apparatus and chucked and held by the chuck C.

In step S1004, three-dimensional positional measurement is performed for only the reference marks RM on the two sides of the silicon ball 1 by the three-dimensional position detector 3AS in the exposure apparatus. In this step, to control the three-dimensional position, the measurement is performed for six axes, i.e., the x, y, and z axes and the rotation components ωx, ωy, and ωz around the respective axes.

In step S1005, the holder H is moved below the reticle 1002 by the XY-stage XY/S with the laser interferometer and the Z-stage Z/S while tee-up-chucking the silicon ball 1. The position and posture of the holder H along the six axes are corrected by the XY-stage XY/S and the Z-stage Z/S on the basis of the measurement results (relative positional relationship between the silicon ball and the reference mark) in steps S1002 and S1004. Then, the reticle 1002 is illuminated with exposure light emitted by the exposure light source 1005 through the illumination light source ILM' to expose the silicon ball 1.

In step S1006, whether all the silicon balls 1 have been exposed is checked. If NO in step S1006, the flow returns to step S1004 to execute steps S1004 and S1005 for the next silicon ball 1 to be exposed. If YES in step S1006, a series of processes end.

FIGS. 27 to 34 show steps S1003 to S1006, i.e., the steps of fixing the holder H tee-up-chucking the silicon balls 1 to the chuck C, aligning the holder H with respect to the exposure apparatus by the two three-dimensional position detectors 3AS, and executing exposure. FIGS. 21 and 22 show steps S1001 and S1002, i.e., the steps of detecting the positional relationship between each silicon ball 1 and the holder H.

Figure 27:
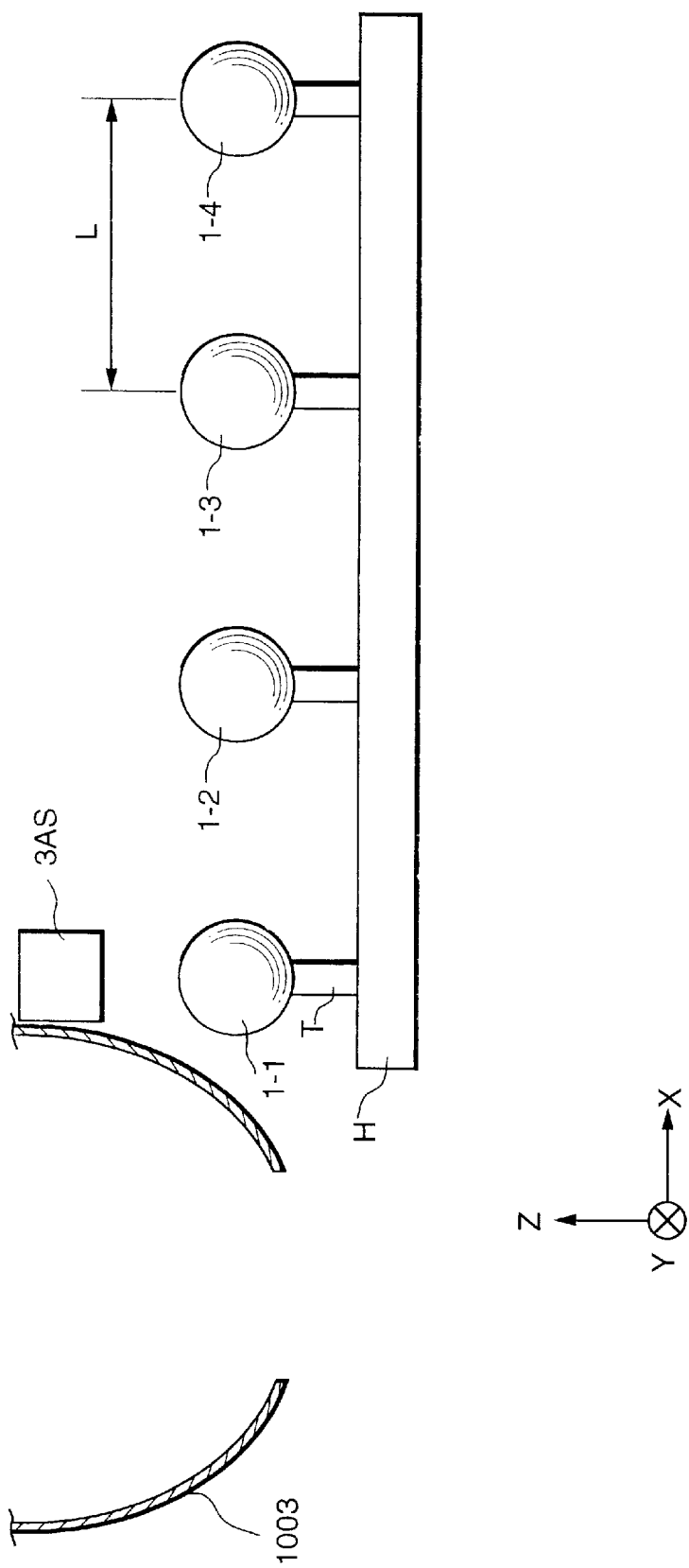
FIG. 27 is a view showing the positional relationship between the holder and the exposure apparatus when the holder is set at the start position.

After the holder H is fixed to the chuck C (step S1003), the holder H is moved to the start position, i.e., the position where the first silicon ball 1-1 faces an alignment scope serving as the three-dimensional position detector 3AS, as shown in FIG. 27.

Figure 28:
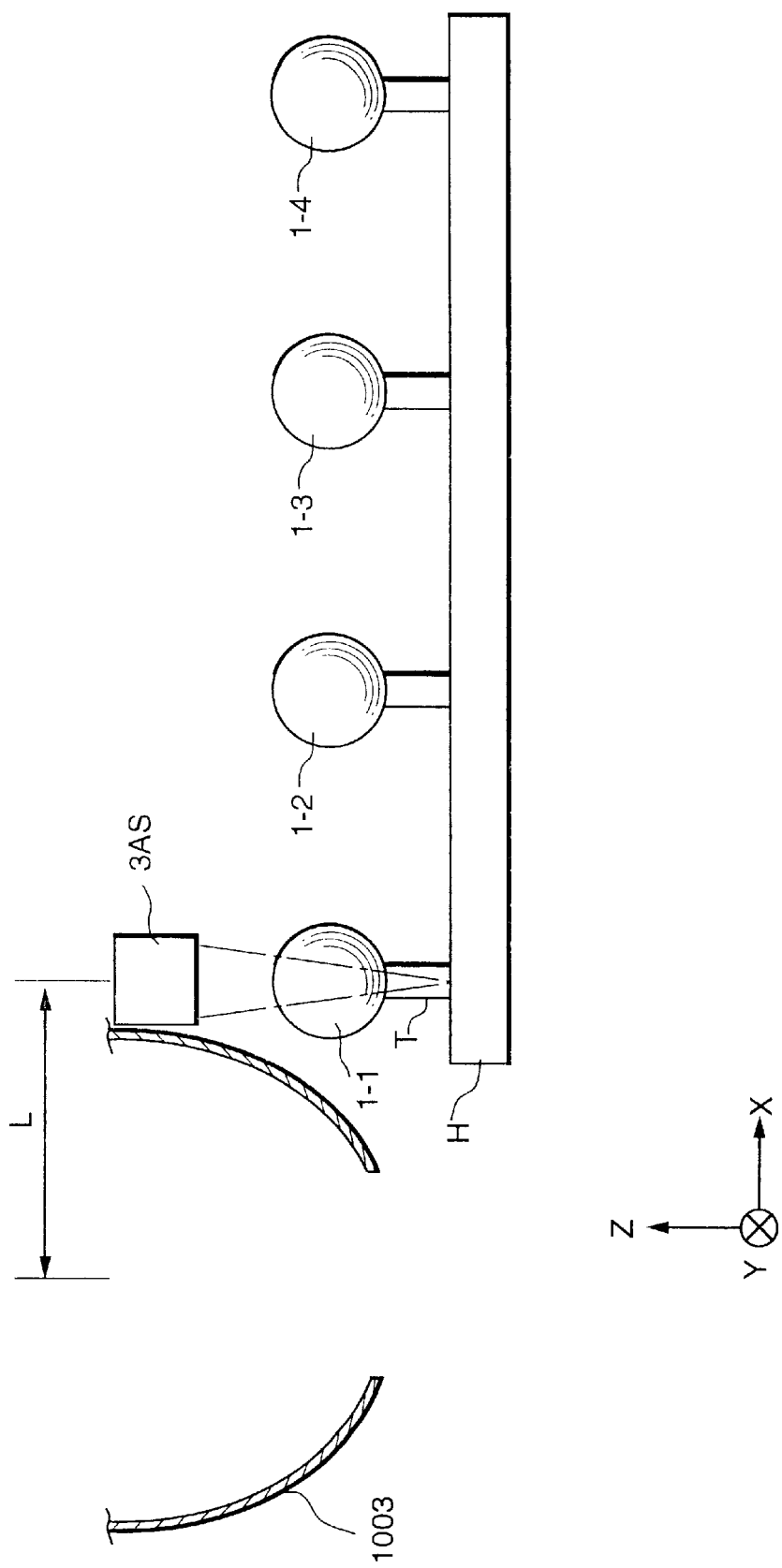
FIG. 28 is a view showing the state of detecting the position of a reference mark on the holder that corresponds to the first silicon ball.

As shown in FIG. 28, the holder H is moved in the positive direction of the z-axis, i.e., the direction to bring the silicon ball 1-1 close to the three-dimensional position detectors 3AS until the two three-dimensional position detectors 3AS can detect the positions of two reference marks RM1-1L and RM1-1R for aligning the silicon ball 1-1. In this state, the two three-dimensional position detectors 3AS simultaneously detect the three-dimensional positions of the reference marks RM1-1L and RM1-1R (step S1004).

Figure 29:
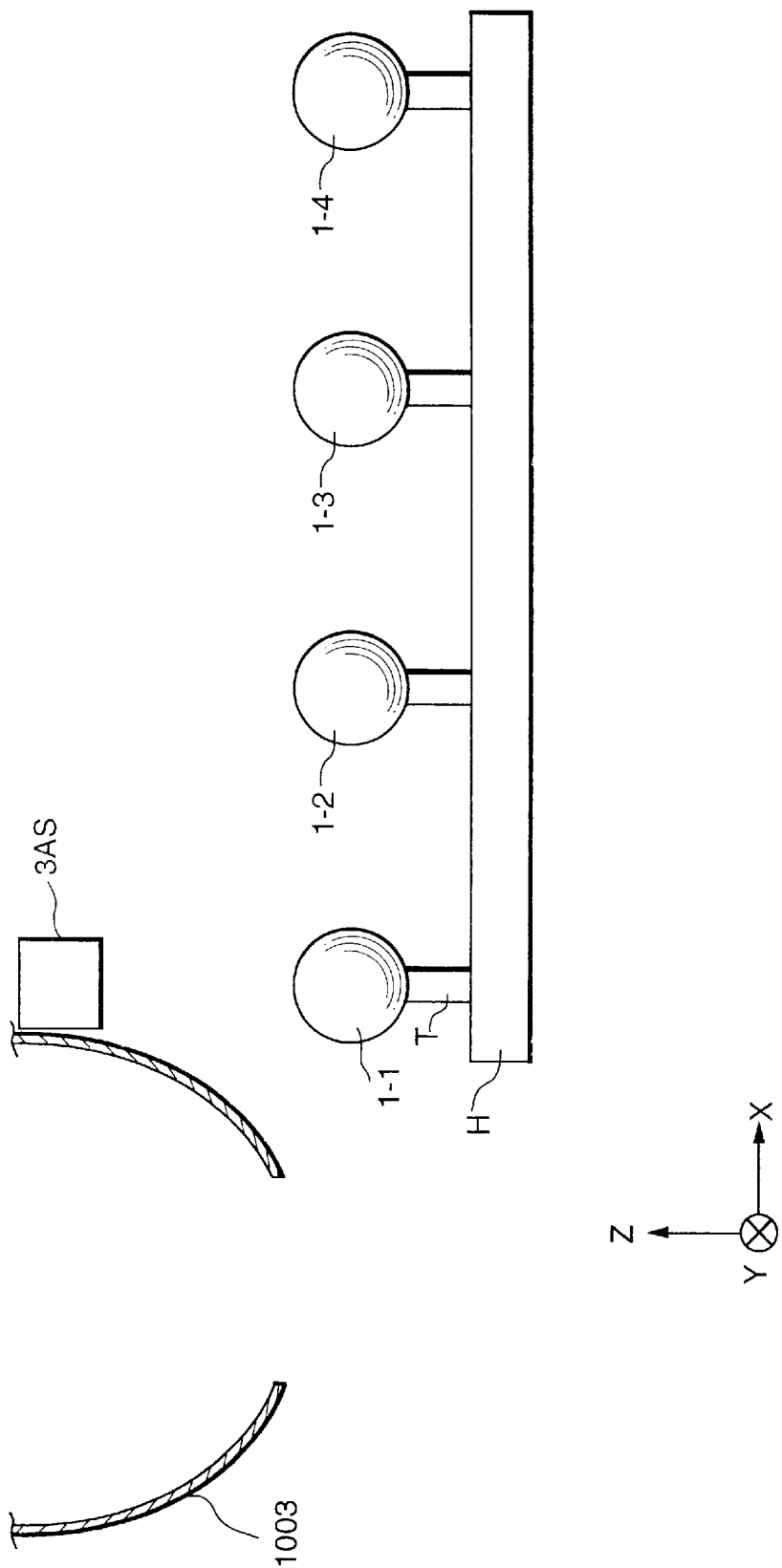
FIG. 29 is a view showing the state of moving the first silicon ball away from the three-dimensional position detector 3AS.

As shown in FIG. 29, the holder H is moved in the negative direction of the z-axis, i.e., the direction to move the silicon ball 1-1 apart from the three-dimensional position detectors 3AS.

Figure 30:
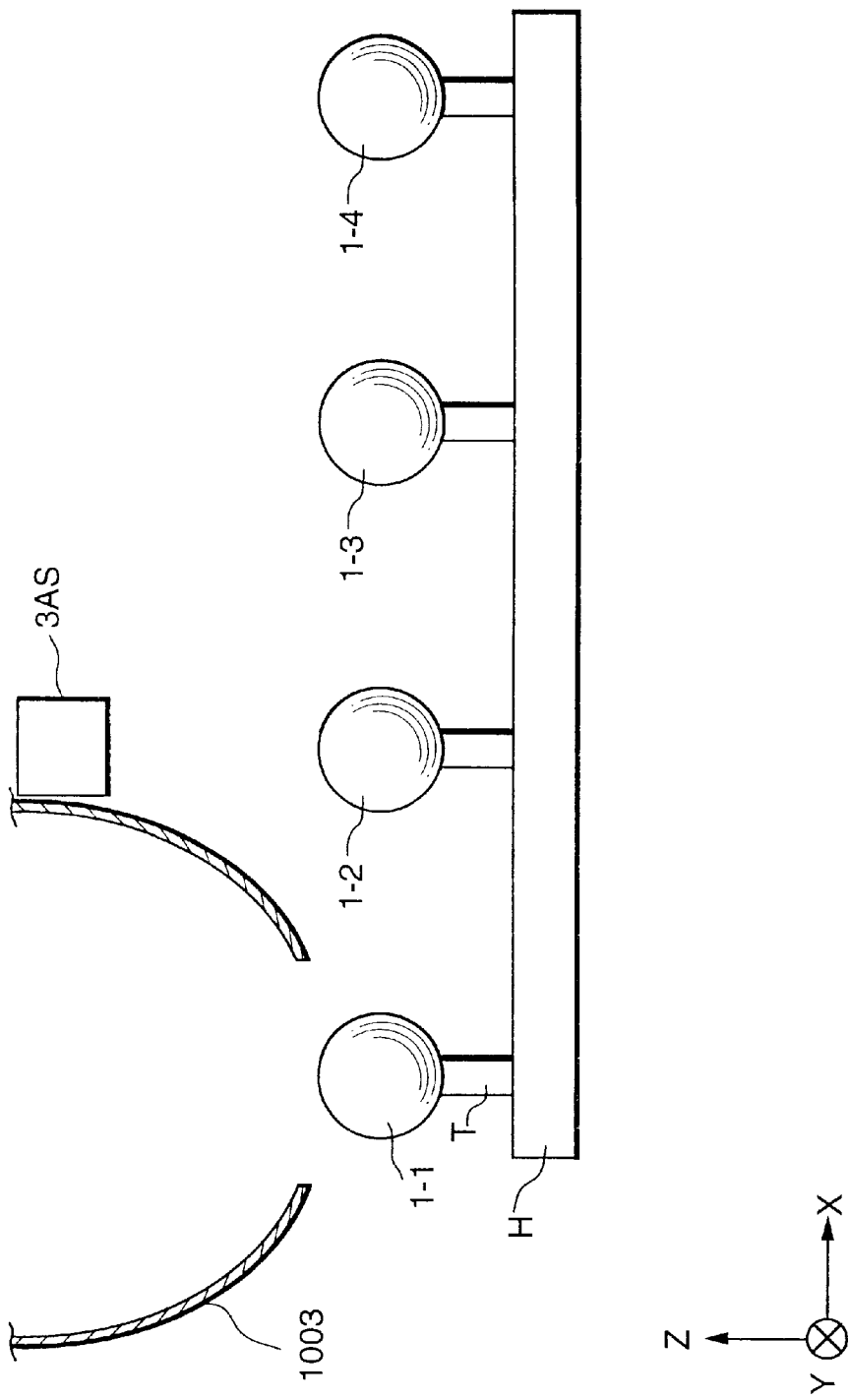
FIG. 30 is a view showing the state of making the first silicon ball face a mirror.

As shown in FIG. 30, the holder H is moved in the negative direction of the x-axis to the position where the first silicon ball 1-1 faces the mirror 1003.

Figure 31:
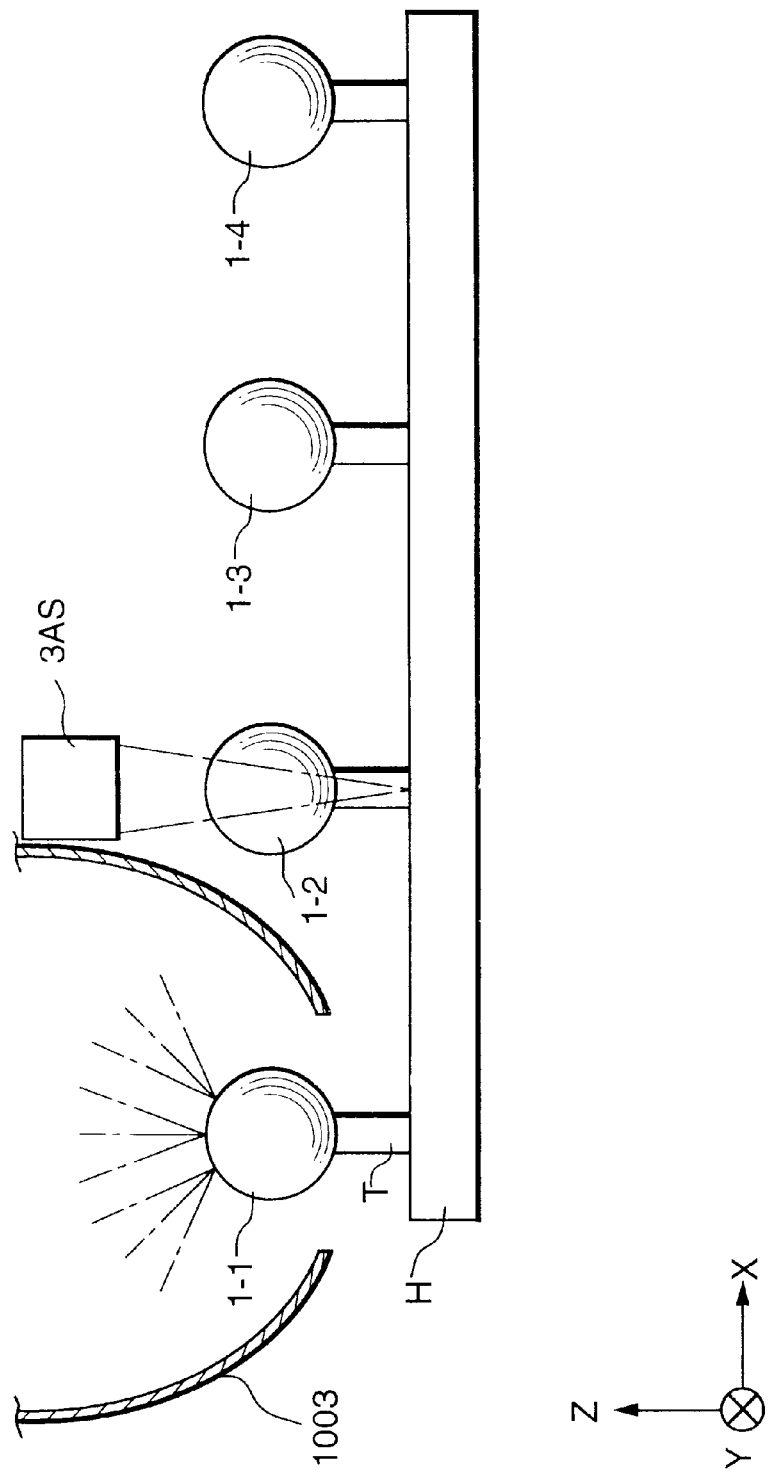
FIG. 31 is a view showing the state of exposing the first silicon ball and detecting the position of a reference mark on the holder that corresponds to the second silicon ball.

As shown in FIG. 31, the holder H is moved in the positive direction of the z-axis until the silicon ball 1-1 and the mirror 1003 have a positional relationship (exposure position) shown in FIG. 24. The moving amount of the holder H reflects the correction value derived from the measurement results in steps S1002 and S1004. In this state, a desired circuit pattern is exposed on the first silicon ball 1-1 (step S1005).

If a distance between the measurement position of the three-dimensional position detector 3AS and the exposure position of the exposure apparatus is set equal to the arrangement interval L between the silicon balls 1, the three-dimensional positions of reference marks RM1-2L and RM1-2R for aligning the second silicon ball 1-2 can be detected simultaneously when the circuit pattern is exposed on the first silicon ball 1-1.

An allowable error for the distance between the measurement position of the three-dimensional position detector 3AS and the exposure position of the exposure apparatus and the arrangement interval L between the silicon balls 1 is defined as follows. That is, the detectable range of the three-dimensional position detector 3AS in the x and y directions is set larger than the sum of an error generated in chucking each silicon ball 1 by the tee T, a formation error generated in forming an attachment portion for the tee T on the holder H, an attachment error generated in attaching the tee T to the holder H, and an error (also including a change with time) of the distance between the three-dimensional position detector 3AS and the exposure portion (mirror 1003 and the like). In short, the three-dimensional position detector 3AS can only measure the positions of reference marks RM for a next silicon ball 1 during exposure of one silicon ball 1.

Figure 32:
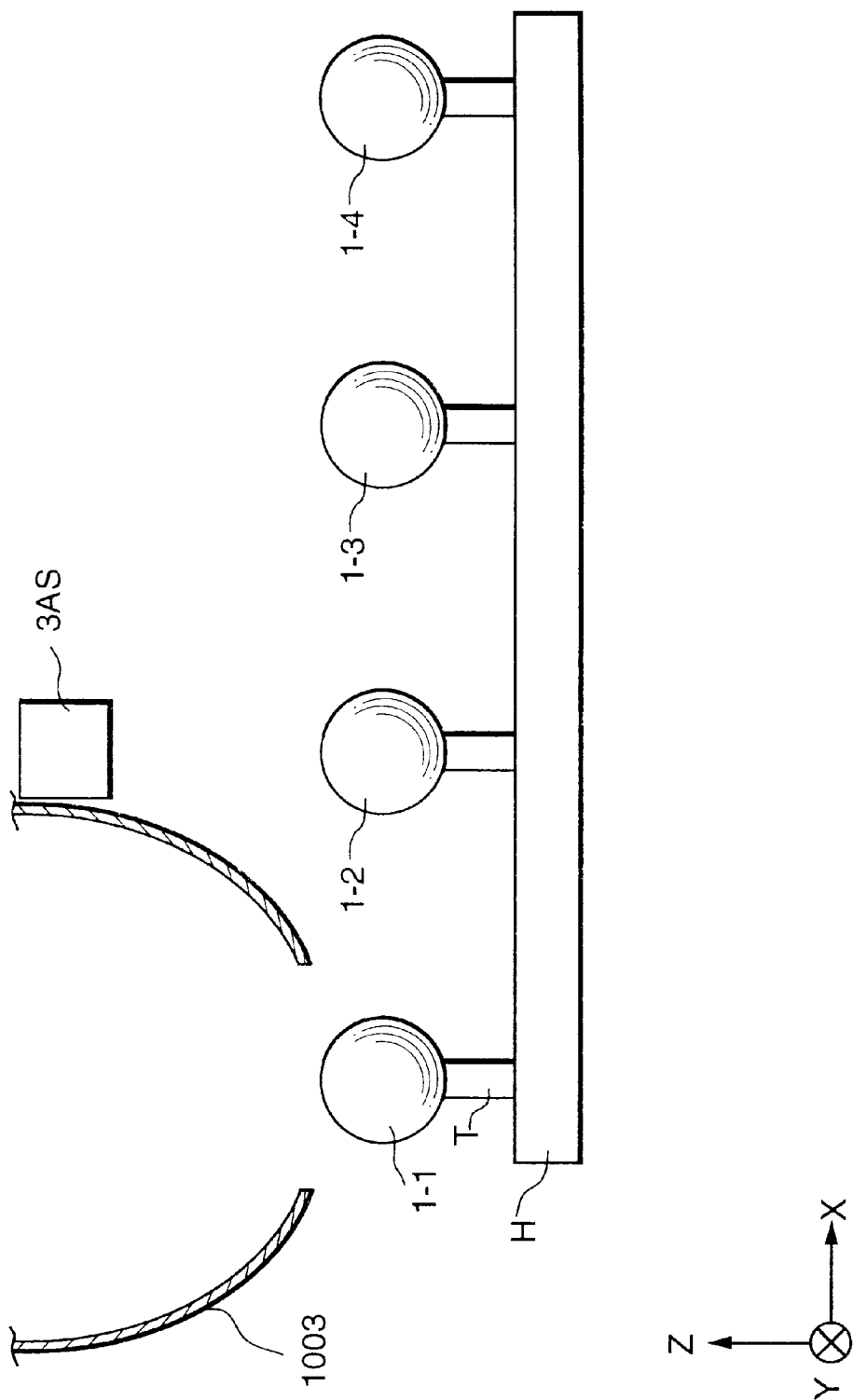
FIG. 32 is a view showing the state of moving the first and second silicon balls away from the mirror and the three-dimensional position detector, respectively.

Upon completion of the exposure of the first silicon ball 1-1 and the detection of the reference marks for the second silicon ball 1-2 in the above manner, the holder H is moved in the negative direction of the z-axis, i.e., the direction to move the silicon ball 1-1 apart from the mirror 1003, as shown in FIG. 32.

Figure 33:
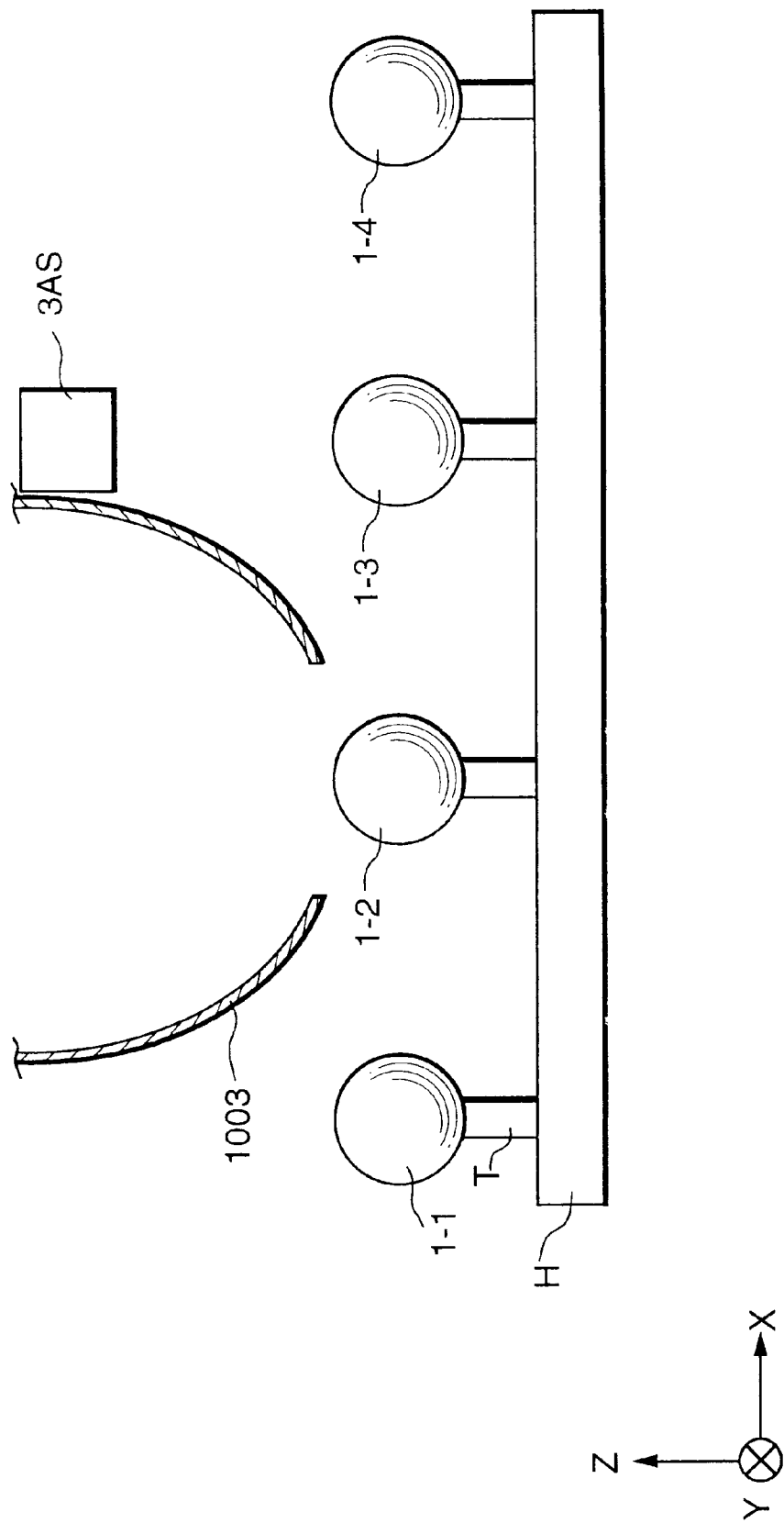
FIG. 33 is a view showing the state of making the second silicon ball face the mirror.

As shown in FIG. 33, the holder H is moved in the negative direction of the x-axis until the second silicon ball 1-2 faces the mirror 1003, in other words, to the position where the third silicon ball 1-3 faces the three-dimensional position detector 3AS.

Figure 34:
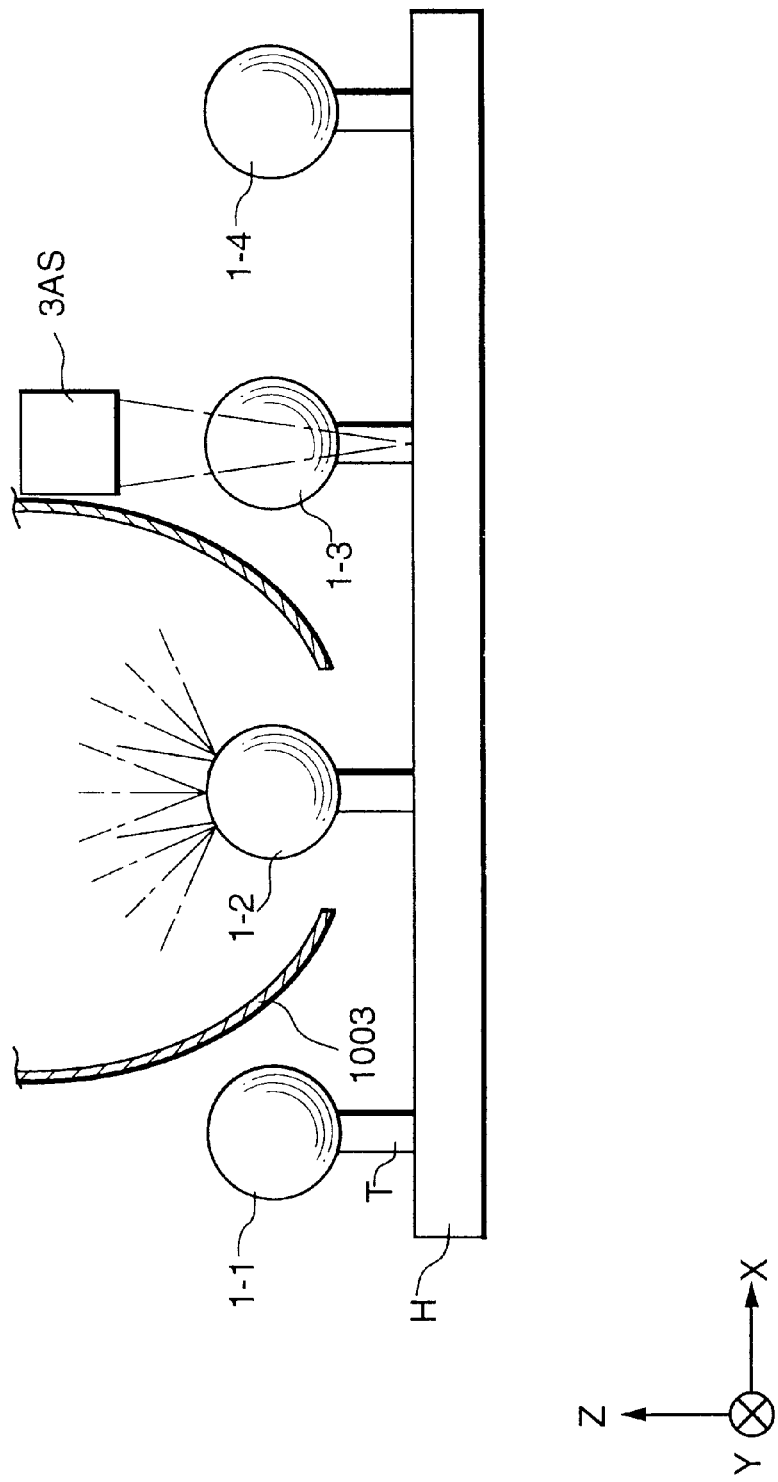
FIG. 34 is a view showing the state of exposing the second silicon ball and detecting the position of a reference mark on the holder that corresponds to the third silicon ball.

As shown in FIG. 34, the holder H is moved in the positive direction of the z-axis until the second silicon ball 1-2 and the mirror 1003 have a positional relationship (exposure position) shown in FIG. 24. In this state, the desired circuit pattern is exposed on the second silicon ball 1-2, while the three-dimensional positions of reference marks RM1-3L and RM1-3R for the third silicon ball 1-3 are detected by the three-dimensional position detector 3AS.

By repeatedly executing the above sequence, a plurality of silicon balls 1 can be successively aligned and exposed.

The processing in step S1002, i.e., the method of obtaining the three-dimensional positional relationship between the holder H (more specifically, the reference mark) and the silicon ball 1 will be explained.

FIG. 23 is a view schematically showing a system for chucking the silicon ball 1 by the tee T of the holder H, obtaining the positional relationship between the holder H and the silicon ball 1, and executing exposure. A chuck station (CS) 201 is a station for chucking the silicon ball 1 by the tee T of the holder H. An alignment station (AS) 202 is a station for obtaining the positional relationship between the silicon ball 1 on the tee T and the holder H. An exposure station (ES) 203 is a station (exposure apparatus shown in FIG. 23) for executing exposure.

Prior to the execution of exposure, a photoresist or the like as a photosensitive material is applied on the surfaces of a plurality of silicon balls 1. In the chuck station (CS) 201, to make preparation for exposure, the silicon balls 1 are placed on the tees T of the holder H and supported by the tees T by vacuum chucking or electrostatic chucking. The holder H supporting the silicon balls 1 can be directly moved to the alignment station (AS) 202 and the exposure station (ES) 203.

In the second embodiment, the precision required to chuck the silicon ball 1 by the tee T of the holder H is set such that errors of the rotation components around the three-dimensional (x, y, and z) axes fall within a negligible range in terms of the relationship with the precision required to form a pattern on the silicon ball 1. In this case, alignment processing in the exposure apparatus is facilitated because alignment along only the x-, y-, and z-axes is considered.

The holder H supporting the silicon balls 1 is conveyed to the alignment station (AS) 202. The alignment station (AS) 202 comprises the X-Y stage and the Z stage capable of three-dimensionally driving the holder H, and at least one three-dimensional position detector 3AS. In the case using driving of the holder H by the stages, only one three-dimensional position detector 3AS is arranged commonly to detect the total of three reference marks, i.e., one reference mark formed near the top of the silicon ball 1 and two reference marks on the two sides of the tee T of the holder H. In the case not using driving of the holder H by the stages, three three-dimensional position detectors 3AS are arranged to detect the respective reference marks.

FIGS. 21 and 22 are views showing the state of detecting the three-dimensional relative positional relationship between the silicon ball chucked by the tee T of the holder H and the reference marks formed on the holder H in the alignment station (AS) 202. FIG. 21 schematically shows the state of detecting the three-dimensional position of the reference mark near the top of the silicon ball 1-1 by the three-dimensional position detector 3AS in the alignment station (AS) 202. FIG. 22 schematically shows the state of detecting the three-dimensional positions of the reference marks formed on the two sides of the tee T of the holder H by the three-dimensional position detector 3AS in the alignment station (AS) 202.

The principle of three-dimensional position detection by the three-dimensional position detector 3AS arranged in the alignment station (AS) 202 will be explained below.

Of a beam emitted by a halogen lamp 11 and a beam reflected by a reflecting mirror 12, a beam having a wavelength selected by wavelength selecting filters 13a (long-wavelength side) and 13b (short-wavelength side) is incident on a fiber 14. The beam through the exit end of the fiber 14 passes through a condenser lens 15, an aperture stop 16, a field stop 17, a dichroic mirror 18, an illumination system lens 19, a prism 20, a quarter-wave plate (made up of 21b and 21b), and an objective lens 101.

When the position of the silicon ball 1-1 is to be detected, the beam passing through the objective lens 101 illuminates the reference mark (e.g., a mark having the same shape as the reference mark RM shown in FIG. 11 can be used) near the top of the silicon ball 1-1, as shown in FIG. 21. When the position of the holder H is to be detected, the beam passing through the objective lens 101 illuminates the reference mark RM1-1L (RM1-1R) on the holder H, as shown in FIG. 22.

The beam reflected by the reference mark on the silicon ball 1-1 or the reference mark RM1-1L (RM1-1R) formed on the holder H changes in polarized state through the objective lens 101 and the quarter-wave plate (made up of 21a and 21b). The beam is reflected by surfaces 20a and 20b of the prism 20 and formed into an image on a two-dimensional image sensing element 24 such as a CCD camera through a relay lens 22 and an erector lens 23. In the two-dimensional image sensing element 24, positional shifts of the holder H in the x and y directions are detected on the basis of the image position of the reference mark near the top of the silicon ball 1 or the image positions of the reference marks RM1-1L and RM1-1R formed on the two sides of the silicon ball 1 on the holder H.

As a so-called image processing alignment method of photoelectrically converting the image of the mark, e.g., the method disclosed in Japanese Patent Laid-Open No. 3-61820 is used. This method is a technique whose effects and functions have been confirmed by practical products.

The principle of detecting the position in the z direction by the three-dimensional position detector shown in FIGS. 21 and 22 will be explained.

A beam emitted by a z-direction detecting unit 25 is reflected by the dichroic mirror 18 and passes through the illumination system lens 19, the prism 20, the quarter-wave plate (made up of 21b and 21b), and the objective lens 101. When the position of the silicon ball 1 is to be detected, the beam passing through the objective lens 101 illuminates the reference mark near the top of the silicon ball 1, as shown in FIG. 21. When the position of the holder H is to be detected, the beam passing through the objective lens 101 illuminates the reference mark RM1-1L (RM1-1R) on the holder H, as shown in FIG. 22.

The beam reflected by the reference mark formed on the silicon ball 1 or on the holder H is incident on the surfaces 20a and 20b of the prism 20 through the objective lens 101 and the quarter-wave plate (made up of 21a and 21b). The surfaces 20a and 20b of the prism 20 function as a polarization beam splitter for the xy-direction position detection wavelength described above, and have characteristics of transmitting light for the z-direction position detection wavelength.

The beam transmitting through the prism 20 is reflected by the dichroic mirror 18 to be incident on the z-direction detecting unit 25. By detecting a positional shift of the beam on the sensor, the position in the z direction is detected.

When the alignment station (AS) 202 comprises only one three-dimensional position detector 3AS, for example, the three-dimensional position of the reference mark RM1-1L on the left side of the silicon ball 1-1 is detected, and then the X-Y stage XY/S is moved along the y-axis to detect the three-dimensional position of the right reference mark RM1-1R.

By the above processing, the three-dimensional relative positional relationship between the holder H and the silicon ball 1-1 can be obtained. By repeatedly executing this processing for the silicon ball 1-2 and subsequent silicon balls, the three-dimensional relative positional relationships between a plurality of silicon balls 1 chucked by the holder H and the holder H (more specifically, corresponding reference marks RM) can be obtained. The positional relationships obtained in this manner are stored in the memory of a CPU 204. The holder H is conveyed from the alignment station (AS) to the exposure station (ES) 203 while tee-up-chucking a plurality of silicon balls 1. In the exposure station (ES) 203, exposure is executed while each silicon ball 1 is aligned on the basis of information about the positional relationship stored in the memory.

When the alignment station (AS) 202 comprises another three-dimensional position detector 3AS along the y-axis in FIGS. 21 and 22, the three-dimensional positions of the reference marks RM (e.g., RM1-1L and RM1-1R) on the two sides of each silicon ball 1 can be detected without driving the X-Y stage XY/S in the y direction.

The three-dimensional position detector 3AS shown in FIGS. 21 and 22 employs the image processing method as a position detecting method in the x and y directions. However, the present invention is not limited to this. As another method, a method of relatively scanning a laser beam or a heterodyning interference method is suitable. If no reference mark is used, the same effects as those described above can be attained by adopting a position detecting method capable of two-dimensionally measuring the relative positional relationship between the silicon ball and the reference mark on the holder.

The three-dimensional position detector 3AS shown in FIGS. 21 and 22 employs the method of detecting a positional shift of the beam as a position detecting method in the z direction. However, the present invention is not limited to this. As another method, an astigmatism method of detecting a change in shape of the beam or a method using an electrostatic capacitance sensor is available.

As the three-dimensional position detecting method in the alignment station AS and the exposure station ES, another detecting method may be adopted.

In the exposure apparatus (exposure station ES) shown in FIG. 24, the three-dimensional position of each reference mark formed on the holder H in correspondence with each ball-like device material is measured. However, the present invention is not limited to this. For example, a method of detecting the positions of at least two reference marks on the holder may be employed. In this case, six-axis position control is performed for each silicon ball in the exposure station ES on the basis of the relative positional relationship between the silicon ball and the reference marks on the holder that is obtained in the alignment station AS. Note that the alignment precision in this case is influenced by both the precision of the X-Y stage in the alignment station (AS) and the precision of the X-Y stage in the exposure station (ES).

According to the present invention, a device material such as a ball-like device material can be exposed with a high throughput.

The present invention is not limited to the above embodiments and various changes and modifications can be made within the spirit and scope of the present invention. Therefore, to apprise the public of the scope of the present invention the following claims are made.

What is claimed is:

1. An exposure apparatus for exposing a pattern on a device material, comprising:

a device material holding portion for holding a ball-like device material; and an exposure portion for exposing the pattern on at least a half region of an entire surface of said ball-like device material at once, wherein said exposure portion comprises:

a light source;

a focusing optical system for focusing light emitted by said light source on a first position; and an elliptic mirror having a first focal point at the first position, and a second focal point at a central position of said device material when said ball-like device material is held at a proper position by said device material holding portion.

2. An exposure apparatus for exposing a pattern on a device material, comprising:

a device material holding portion for holding a ball-like device material; and an exposure portion for exposing the pattern on at least a half region of an entire surface of said ball-like device material at once, wherein said exposure portion comprises:

a reticle holding portion for holding a reticle, said reticle having a hologram recorded thereon for forming a pattern to be exposed on said ball-like device material, and exposes the pattern on said ball-like device material using a reproduced pattern of the hologram;

a light source;

a focusing optical system for focusing light emitted by said light source on a first position; and an elliptic mirror having a first focal point at the first position, and a second focal point at a central position of said device material when said ball-like device material is held at a proper position by said device material holding portion.

3. An exposure apparatus for exposing a pattern on a device material, comprising:

a device material holding portion for holding a ball-like device material; and an exposure portion for exposing the pattern on at least a half region of an entire surface of said ball-like device material at once, wherein said exposure portion comprises a reticle holding portion for holding a reticle, said reticle having a hologram recorded thereon for forming a pattern to be exposed on said ball-like device material, and exposes the pattern on said ball-like device material using a reproduced pattern of the hologram, wherein the hologram includes:

a first hologram for exposing a band-like region of a surface of said ball-like device material; and a second hologram for exposing a circular region of the surface of said ball-like device material on an optical system side.

4. The apparatus according to claim 3, wherein said exposure portion comprises:

a first illumination system for illuminating the first hologram; and a second illumination system for illuminating the second hologram.

5. The apparatus according to claim 4, wherein said first illumination system comprises:

a light source;

a focusing optical system for focusing light emitted by said light source on a first position; and an elliptic mirror having a first focal point at the first position and a second focal point at a central position of said device material when said ball-like device material is held at a proper position by said device material holding portion.

6. The apparatus according to claim 5, wherein said focusing optical system constituting said first illumination system has a portion for passing through light emitted by said light source as a substantially parallel light beam, and said portion and said light source constitute said second illumination system.

7. The apparatus according to claim 6, wherein said portion for passing through light emitted by said light source as a substantially parallel light beam is an opening portion.

8. An exposure apparatus for exposing a pattern on a device material, comprising:

a device material holding portion for holding a ball-like device material; and an exposure portion for exposing the pattern on at least a half region of an entire surface of said ball-like device material at once, wherein said device material holding portion comprises a tee for chucking and holding said ball-like device.

9. The apparatus according to claim 8, wherein said device material holding portion comprises a chuck for holding a holder having at least one tee.

10. The apparatus according to claim 9, wherein said holder has an alignment reference mark.

11. The apparatus according to claim 10, further comprising a position detector for detecting a position of the reference mark.

12. The apparatus according to claim 8, wherein said ball-like device material has an alignment reference mark.

13. The apparatus according to claim 12, further comprising a position detector for detecting a position of the reference mark.

14. The apparatus according to claim 9, wherein said holder and said ball-like device material have alignment reference marks, respectively.

15. The apparatus according to claim 14, wherein the reference mark of said holder is formed in correspondence with each tee.

16. The apparatus according to claim 15, further comprising:

a memory for storing information representing a positional relationship between the reference mark of said holder and the reference mark of said ball-like device material held by said tee;

a position detecting portion for detecting a position of the reference mark of said holder; and a driving portion for adjusting a position of said holder, and wherein said driving portion adjusts the position of said holder on the basis of the information stored in said memory and a detection result obtained by said detecting portion, and aligns said ball-like device material held by said holder to a proper position.

17. A method of aligning a ball-like device material, comprising:

the holding step of holding at least one ball-like device material by a holding portion;

the first detecting step of detecting a positional relationship between said ball-like device material and said holding portion;

the mounting step of mounting said holding portion on an exposure apparatus;

the second detecting step of detecting a position of said holding portion; and the aligning step of adjusting the position of said holding portion on the basis of detection results in the first and second detecting steps, and aligning said ball-like device held by said holding portion to a proper position.

18. An exposure apparatus for exposing a pattern on a ball-like device material, comprising:

a reticle holding portion for holding a reticle having a kinoform recorded thereon for forming a pattern;

a device material holding portion for holding said ball-like device material; and an exposure portion for reproducing the pattern of the kinoform by using light emitted from an excimer laser and exposing the pattern on said ball-like device material, wherein said exposure portion exposes, through a parabolic mirror, a backside portion of a surface of said ball-like device material when viewed from said reticle.

19. An exposure apparatus for exposing a pattern on a ball-like device material, comprising:

a reticle holding portion for holding a reticle having a kinoform recorded thereon for forming a pattern;

a device material holding portion for holding said ball-like device material; and an exposure portion for reproducing the pattern of the kinoform by using light emitted from an excimer laser and exposing the pattern on said ball-like device material, wherein said exposure portion exposes, through an elliptic mirror, a backside portion of a surface of said ball-like device material when viewed from said reticle.

20. An exposure apparatus for exposing a pattern on a ball-like device material, comprising:

a reticle holding portion for holding a reticle having a kinoform recorded thereon for forming a pattern;

a device material holding portion for holding said ball-like device material; and an exposure portion for reproducing the pattern of the kinoform by using light emitted from an excimer laser and exposing the pattern on said ball-like device material, wherein the kinoform is formed to allow a principal ray to strike each point on a surface of said ball-like device material in exposure; and wherein the kinoform is formed to reduce illuminance irregularity by diffracting light so as to fall outside an angle used in exposure.

21. An exposure apparatus for exposing a pattern on a ball-like device material, comprising:

a reticle holding portion for holding a reticle having a kinoform recorded thereon for forming a pattern;

a device material holding portion for holding said ball-like device material; and an exposure portion for reproducing the pattern of the kinoform by using light emitted from an excimer laser and exposing the pattern on said ball-like device material, wherein the kinoform is optimized on the basis of a genetic algorithm.

22. An exposure apparatus for exposing a pattern on a ball-like device material, comprising:

a reticle holding portion for holding a reticle having a kinoform recorded thereon for forming a pattern;

a device material holding portion for holding said ball-like device material; and an exposure portion for reproducing the pattern of the kinoform by using light emitted from an excimer laser and exposing the pattern on said ball-like device material, wherein the kinoform is optimized on the basis of simulated annealing.

23. An exposure apparatus for exposing a pattern on a ball-like device material, comprising:

a reticle holding portion for holding a reticle having a kinoform recorded thereon for forming a pattern;

a device material holding portion for holding said ball-like device material; and an exposure portion for reproducing the pattern of the kinoform by using light emitted from an excimer laser and exposing the pattern on said ball-like device material, wherein said device material holding portion comprises a tee for chucking and holding said ball-like device material, and a chuck for holding a holder having one or a plurality of tees, and said holder has an alignment reference mark.

24. The apparatus according to claim 23, further comprising a position detector for detecting a position of the reference mark.

25. An exposure apparatus for exposing a pattern on a ball-like device material, comprising:

a reticle holding portion for holding a reticle having a kinoform recorded thereon for forming a pattern;

a device material holding portion for holding said ball-like device material; and an exposure portion for reproducing the pattern of the kinoform by using light emitted from an excimer laser and exposing the pattern on said ball-like device material, wherein said device material holding portion comprises a tee for chucking and holding said ball-like device material, and said ball-like device material has an alignment reference mark.

26. The apparatus according to claim 25, further comprising a position detector for detecting a position of the reference mark.

27. An exposure apparatus for exposing a pattern on a ball-like device material, comprising:

a reticle holding portion for holding a reticle having a kinoform recorded thereon for forming a pattern;

a device material holding portion for holding said ball-like device material; and an exposure portion for reproducing the pattern of the kinoform by using light emitted from an excimer laser and exposing the pattern on said ball-like device material, wherein said device material holding portion comprises a tee for chucking and holding said ball-like device material, and a chuck for holding a holder having one or a plurality of tees, and said holder and said ball-like device material have alignment reference marks, respectively.

28. The apparatus according to claim 27, wherein the reference mark of said holder is formed in correspondence with each tee.

29. The apparatus according to claim 27, further comprising:

a memory for storing information representing a positional relationship between the reference mark of said holder and the reference mark of said ball-like device material held by said tee;

a position detecting portion for detecting a position of the reference mark of said holder; and a driving portion for adjusting a position of said holder, and wherein said driving portion adjusts the position of said holder on the basis of the information stored in said memory and a detection result obtained by said detecting portion, and aligns said ball-like device material held by said holder to a proper position.

* * * * *

UNITED STATES PATENT AND TRADEMARK OFFICE
CERTIFICATE OF CORRECTION

PATENT NO.   :   6,097,472
DATED        :   August 1, 2000
INVENTOR(S)  :   NOBUYOSHI TANAKA, ET AL.

Figure 26:
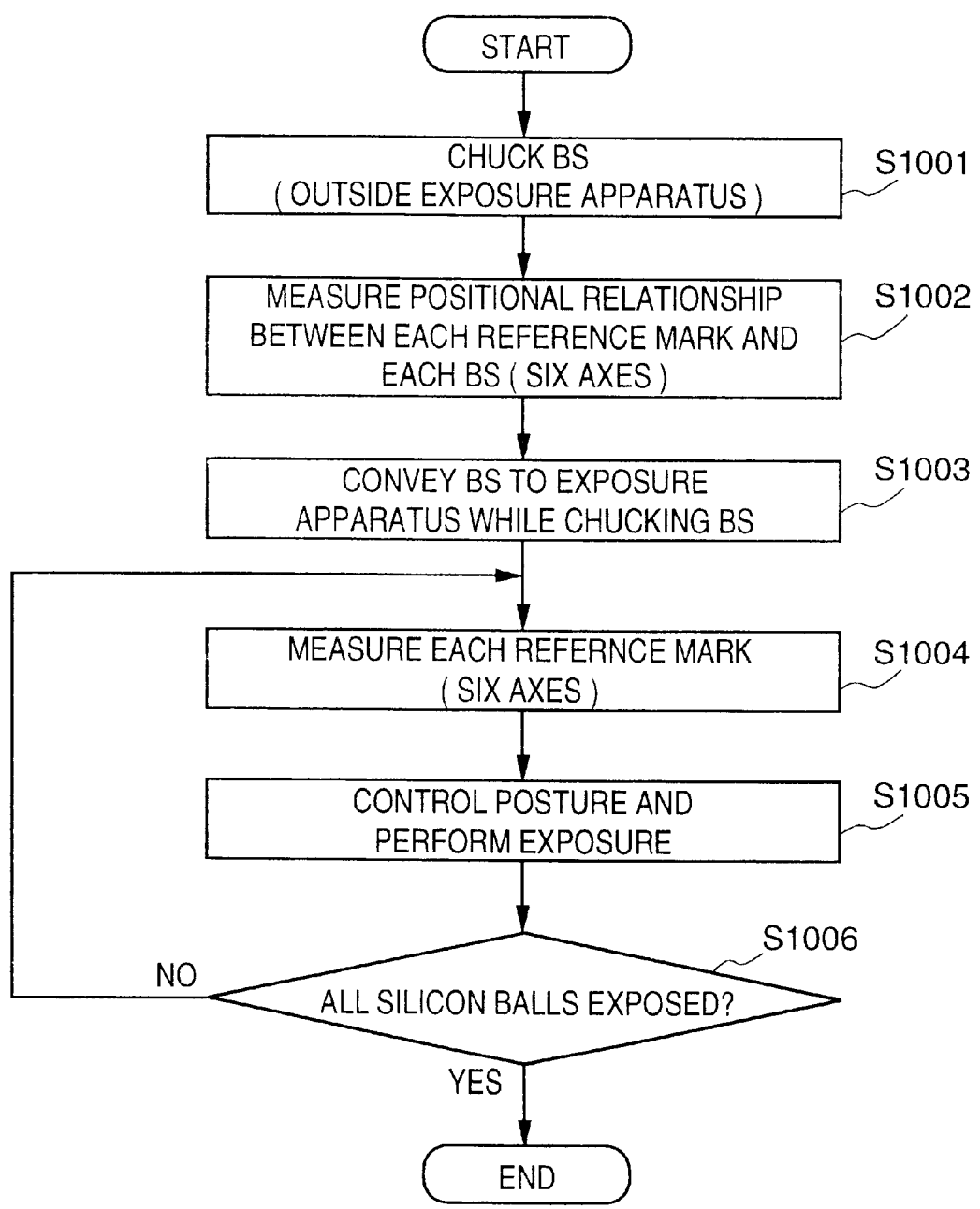
FIG. 26 is a flow chart for explaining alignment and exposure sequences.

It is certified that error appears in the above-identified patent and that said Letters Patent is hereby corrected as shown below:

IN THE DRAWINGS:

SHEET 23, FIG. 26, "REFERNCE" should read --REFERENCE--.

COLUMN 11:

Line 9, "the" (second occurrence) should be deleted.
    Line 14, "the" (third occurrence) should be deleted.
    Line 40, "21b" should read --21a--.

COLUMN 12:

Line 10, "21b" (first occurrence) should read --21a--.

COLUMN 18:

Line 14, "the" (second occurrence) should be deleted.
    Line 19, "the" (third occurrence) should be deleted.
    Line 45, "21b" should read --21a--.

UNITED STATES PATENT AND TRADEMARK OFFICE
CERTIFICATE OF CORRECTION

PATENT NO.    : 6,097,472
DATED         : August 1, 2000
INVENTOR(S)   : NOBUYOSHI TANAKA, ET AL.

It is certified that error appears in the above-identified patent and that said Letters Patent is hereby corrected as shown below:

<u>COLUMN 19</u>:

Line 14, "21b" (first occurrence) should read --21a--.

Signed and Sealed this

Twenty-fourth Day of April, 2001

*Attest:*

NICHOLAS P. GODICI

*Attesting Officer*   Acting Director of the United States Patent and Trademark Office